(12) United States Patent
Nakamura et al.

(10) Patent No.: US 12,251,735 B2
(45) Date of Patent: Mar. 18, 2025

(54) SUBSTRATE CLEANING DEVICE AND SUBSTRATE CLEANING METHOD

(71) Applicant: SCREEN HOLDINGS CO., LTD., Kyoto (JP)

(72) Inventors: Kazuki Nakamura, Kyoto (JP); Junichi Ishii, Kyoto (JP); Tomoyuki Shinohara, Kyoto (JP); Takuma Takahashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 333 days.

(21) Appl. No.: 17/836,009

(22) Filed: Jun. 9, 2022

(65) Prior Publication Data

US 2022/0395866 A1 Dec. 15, 2022

(30) Foreign Application Priority Data

Jun. 11, 2021 (JP) ................................. 2021-098303

(51) Int. Cl.
*B08B 1/00* (2024.01)
*B08B 1/12* (2024.01)
*B08B 1/50* (2024.01)
*B08B 3/02* (2006.01)

(52) U.S. Cl.
CPC .................. *B08B 1/50* (2024.01); *B08B 1/12* (2024.01); *B08B 3/02* (2013.01)

(58) Field of Classification Search
CPC ......... H01L 21/0209; B08B 1/50; B08B 1/12; B08B 3/02
See application file for complete search history.

(56) References Cited

U.S. PATENT DOCUMENTS

| 6,151,744 A * | 11/2000 | Ohtani .............. H01L 21/67051 15/21.1 |
| 8,166,985 B2 * | 5/2012 | Nishiyama ........ H01L 21/67178 134/902 |
| 2009/0202951 A1 * | 8/2009 | Yamamoto ............... B05D 5/06 134/198 |
| 2014/0331440 A1 | 11/2014 | Ishibashi ........................ 15/302 |

(Continued)

FOREIGN PATENT DOCUMENTS

JP H 10-335281 A 12/1998
JP 2000-223460 A 8/2000

(Continued)

OTHER PUBLICATIONS

Notice of Allowance dated Apr. 1, 2024 issued in corresponding Korean Patent Application No. 10-2022-0070103.

(Continued)

*Primary Examiner* — Marc Carlson
(74) *Attorney, Agent, or Firm* — OSTROLENK FABER LLP

(57) ABSTRACT

A substrate is held in a horizontal attitude by a substrate holder. At a processing position, a lower surface of the substrate held by the substrate holder is cleaned by a lower-surface brush. The lower-surface brush is cleaned by a brush cleaner at a waiting position that overlaps with the substrate held by the substrate holder in an up-and-down direction and is below a processing position. The lower-surface brush is lifted and lowered by a lower-surface brush lifting-lowering driver between the processing position and the waiting position.

14 Claims, 28 Drawing Sheets

(56) References Cited

U.S. PATENT DOCUMENTS

| | | | |
|---|---|---|---|
| 2014/0352736 A1* | 12/2014 | Yamamoto | H01L 21/67051 427/553 |
| 2015/0027492 A1* | 1/2015 | Takiguchi | H01L 21/68792 15/88.1 |
| 2016/0236239 A1* | 8/2016 | Nishiyama | B08B 1/12 |
| 2017/0056936 A1* | 3/2017 | Nishiyama | H01L 21/67028 |
| 2017/0221696 A1* | 8/2017 | Nishiyama | H01L 21/68764 |
| 2019/0214245 A1* | 7/2019 | Nishiyama | B08B 7/04 |
| 2020/0055099 A1 | 2/2020 | Chen et al. | |
| 2021/0210338 A1* | 7/2021 | Nishiyama | B08B 1/20 |
| 2022/0093420 A1* | 3/2022 | Shinohara | H01L 21/68764 |
| 2023/0017404 A1 | 1/2023 | Chen et al. | |
| 2024/0157412 A1 | 5/2024 | Chen et al. | |

FOREIGN PATENT DOCUMENTS

| | | | | |
|---|---|---|---|---|
| JP | 3393016 B2 | 4/2003 | | |
| JP | 2003-332287 A | 11/2003 | | |
| JP | 2009-123800 A | 6/2009 | | |
| JP | 2009-277811 | 11/2009 | | |
| JP | 2010-21457 A | 1/2010 | | |
| JP | 5245528 | 7/2013 | | |
| JP | 2014-216456 A | 11/2014 | | |
| JP | 2015-23248 A | 2/2015 | | |
| JP | 2015-032756 A | 2/2015 | | |
| JP | 5904169 | 4/2016 | | |
| JP | 2017-139442 A | 8/2017 | | |
| JP | 2020-136618 A | 8/2020 | | |
| JP | 2021052162 A | * | 4/2021 | B08B 1/04 |
| KR | 10-2009-0087412 A | 8/2009 | | |
| KR | 10-2017-0026198 A | 3/2017 | | |
| WO | WO 2017/163633 A1 | 9/2017 | | |

OTHER PUBLICATIONS

Office Action dated Oct. 22, 2024 issued in corresponding Japanese Patent Application No. 2021-098303.

* cited by examiner

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

PLAN VIEW

SIDE VIEW TAKEN ALONG LINE A-A

SIDE VIEW TAKEN ALONG LINE B-B

SUBSTRATE CLEANING DEVICE AND SUBSTRATE CLEANING METHOD

BACKGROUND

Technical Field

The present invention relates to a substrate cleaning device and a substrate cleaning method for cleaning a lower surface of a substrate.

Description of Related Art

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, a substrate cleaning device described in JP 5904168 B2 includes two suction pads for holding a back-surface peripheral portion of a wafer, a spin chuck for holding a back-surface center portion of the wafer and a brush for cleaning a back surface of the wafer. The two suction pads hold the wafer and move in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

SUMMARY

In a substrate cleaning device, cleanliness of a brush is gradually degraded as a substrate is repeatedly cleaned. When the cleanliness of the brush is degraded, the substrate cannot be efficiently cleaned. Therefore, it is required to maintain the cleanliness of the brush at a certain level or more. However, it is not easy to maintain the cleanliness of the brush without reducing the throughput.

An object of the present invention is to provide a substrate cleaning device and a substrate cleaning method that enable maintenance of cleanliness of a brush without degradation of a throughput.

(1) A substrate cleaning device according to a first invention includes a substrate holder that holds a substrate in a horizontal attitude, a lower-surface brush that cleans a lower surface of the substrate held by the substrate holder at a processing position, a brush cleaner that cleans the lower-surface brush at a waiting position that overlaps with the substrate held by the substrate holder in an up-and-down direction and is below the processing position, and a lower-surface brush lifting-lowering driver that lifts and lowers the lower-surface brush between the processing position and the waiting position.

With this substrate cleaning device, because the waiting position of the lower-surface brush overlaps with the substrate held by the substrate holder in the up-and-down direction, even in a case in which the lower-surface brush is relatively large, a footprint is hardly increased. Therefore, it is possible to clean the lower surface of the substrate in a short period of time by using the relatively large lower-surface brush. Therefore, even in a case in which the step of cleaning the lower-surface brush is provided, a throughput hardly changes. Thus, it is possible to maintain the cleanliness of the lower-surface brush without reducing the throughput.

(2) The substrate cleaning device may further include an upper-surface cleaner that cleans an upper surface of the substrate held by the substrate holder, wherein the lower-surface brush lifting-lowering driver may lift and lower the lower-surface brush between the processing position and the waiting position such that a lower surface of the substrate and the lower-surface brush are cleaned in a period during which the upper surface of the substrate is cleaned by the upper-surface cleaner. In this case, because the lower surface of the substrate and the lower-surface brush are cleaned in a period during which the upper surface of the substrate is cleaned by the upper-surface cleaner, it is possible to maintain the cleanliness of the lower-surface brush without reducing the throughput.

(3) The lower-surface brush lifting-lowering driver may lift and lower the lower-surface brush repeatedly between the processing position and the waiting position such that a lower surface of the substrate and the lower-surface brush are cleaned multiple times. In this case, the lower-surface brush can be cleaned in a short period of time.

(4) The brush cleaner may include a first liquid nozzle that discharges a cleaning liquid to a center portion of the lower-surface brush and a second liquid nozzle that discharges a cleaning liquid to an end portion of the lower-surface brush. With this configuration, even in a case in which the lower-surface brush is relatively large, the entire lower-surface brush can be cleaned easily.

(5) The brush cleaner may include a cleaning tank that stores a cleaning liquid in which the lower-surface brush is immersed. With this configuration, even in a case in which the lower-surface brush is relatively large, the entire lower-surface brush can be cleaned easily. Further, the lower-surface brush can be cleaned in a short period of time.

(6) Each of the substrate holder and the lower-surface brush may have a circular outer shape, and a diameter of the lower-surface brush may be larger than a diameter of the substrate holder. In this case, the lower-surface brush can be relatively large.

(7) Each of the substrate and the lower-surface brush may have a circular outer shape, and a diameter of the lower-surface brush may be larger than ⅓ of a diameter of the substrate. In this case, the lower-surface brush can be relatively large.

(8) A substrate cleaning method according to a second invention includes holding a substrate in a horizontal attitude using a substrate holder, cleaning a lower surface of the substrate held by the substrate holder using a lower-surface brush at a processing position, cleaning the lower-surface brush using a brush cleaner at a waiting position that overlaps with the substrate held by the substrate holder in an up-and-down direction and is below the processing position, and lifting and lowering the lower-surface brush between the processing position and the waiting position.

With this substrate cleaning method, because the waiting position of the lower-surface brush overlaps with the substrate held by the substrate holder in the up-and-down direction, even in a case in which the lower-surface brush is relatively large, a footprint hardly increases. Therefore, it is possible to clean the lower surface of the substrate in a short period of time by using the relatively large lower-surface brush. Therefore, even in a case in which the step of cleaning the lower-surface brush is provided, the throughput hardly changes. Thus, it is possible to maintain the cleanliness of the lower-surface brush without reducing the throughput.

(9) The substrate cleaning method may further include cleaning an upper surface of the substrate held by the substrate holder using an upper-surface cleaner, wherein a lower surface of the substrate and the lower-surface brush may be cleaned in a period during which the upper face of the substrate is cleaned by the upper-surface cleaner. In this case, because the lower surface of the substrate and the lower-surface brush are cleaned in a period during which the upper surface of the substrate is cleaned by the upper-surface cleaner, it is possible to maintain the cleanliness of the lower-surface brush without reducing the throughput.

(10) The Lifting and lowering the lower-surface brush between the processing position and the waiting position may be repeated such that a lower surface of the substrate and the lower-surface brush are cleaned multiple times. In this case, the lower-surface brush can be cleaned in a short period of time.

(11) The cleaning the lower-surface brush using a brush cleaner may include discharging a cleaning liquid to a center portion of the lower-surface brush using a first liquid nozzle and discharging a cleaning liquid to an end portion of the lower-surface brush using a second liquid nozzle. With this configuration, even in a case in which the lower-surface brush is relatively large, the entire lower-surface brush can be cleaned easily.

(12) The cleaning the lower-surface brush using a brush cleaner may include immersing the lower-surface brush in a cleaning liquid stored in a cleaning tank. With this configuration, even in a case in which the lower-surface brush is relatively large, the entire lower-surface brush can be cleaned easily. Further, the lower-surface brush can be cleaned in a short period of time.

(13) Each of the substrate holder and the lower-surface brush may have a circular outer shape, and a diameter of the lower-surface brush may be larger than a diameter of the substrate holder. In this case, the lower-surface brush can be relatively large.

(14) Each of the substrate and the lower-surface brush may have a circular outer shape, and a diameter of the lower-surface brush may be larger than ⅓ of a diameter of the substrate. In this case, the lower-surface brush can be relatively large.

Other features, elements, characteristics, and advantages of the present disclosure will become more apparent from the following description of preferred embodiments of the present disclosure with reference to the attached drawings.

DETAILED DESCRIPTION

A substrate cleaning device and a substrate cleaning method according to embodiments of the present invention will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like. Further, as for a substrate to be used in the present embodiment, at least part of the substrate has a circular outer periphery. For example, the outer periphery except for a notch for positioning is circular.

[1] First Embodiment

(1) Configuration of Substrate Processing Apparatus

Figure 1:
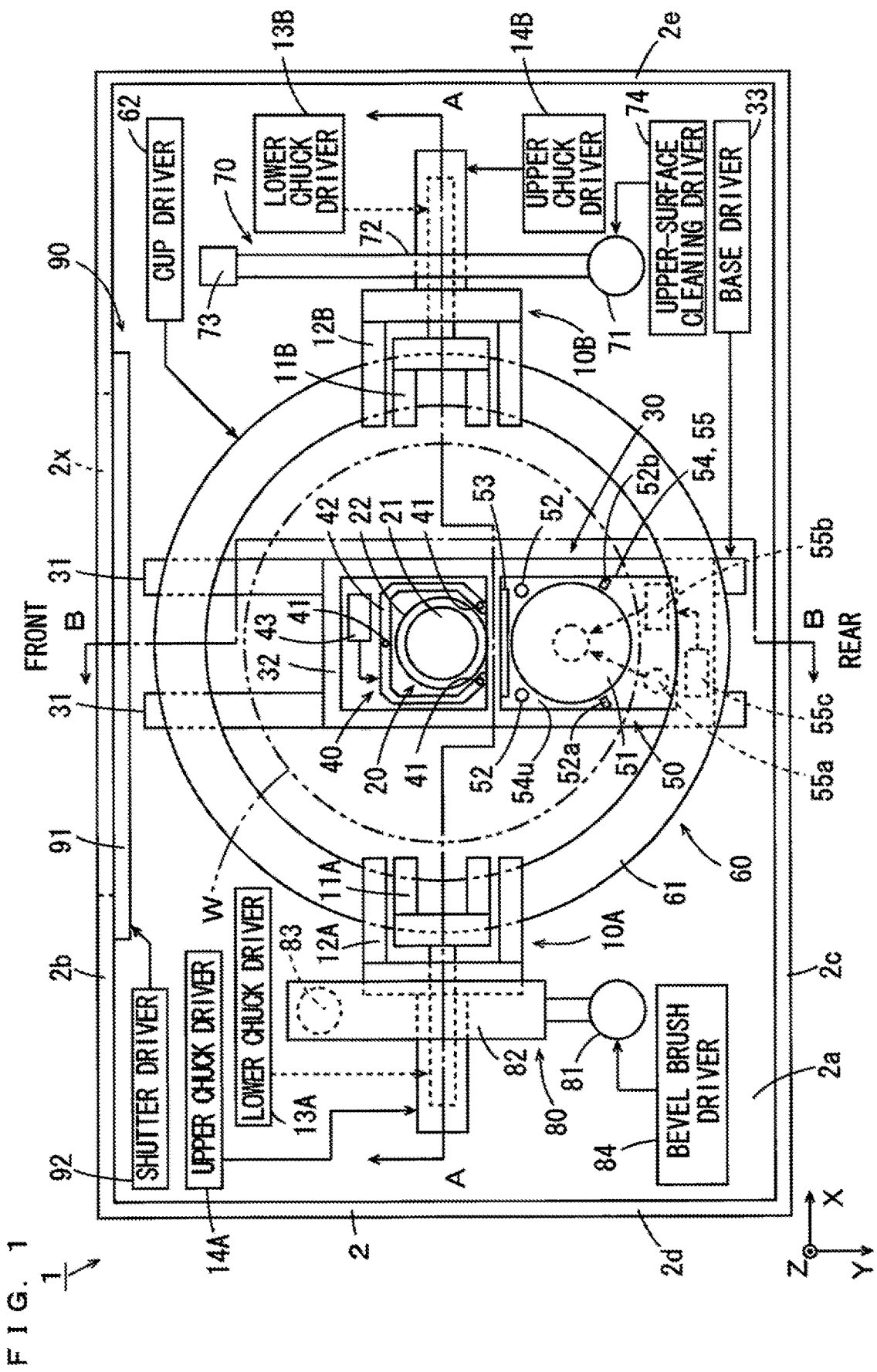
FIG. 1 is a schematic plan view of a substrate cleaning device according to a first embodiment of the present invention.
Figure 2:
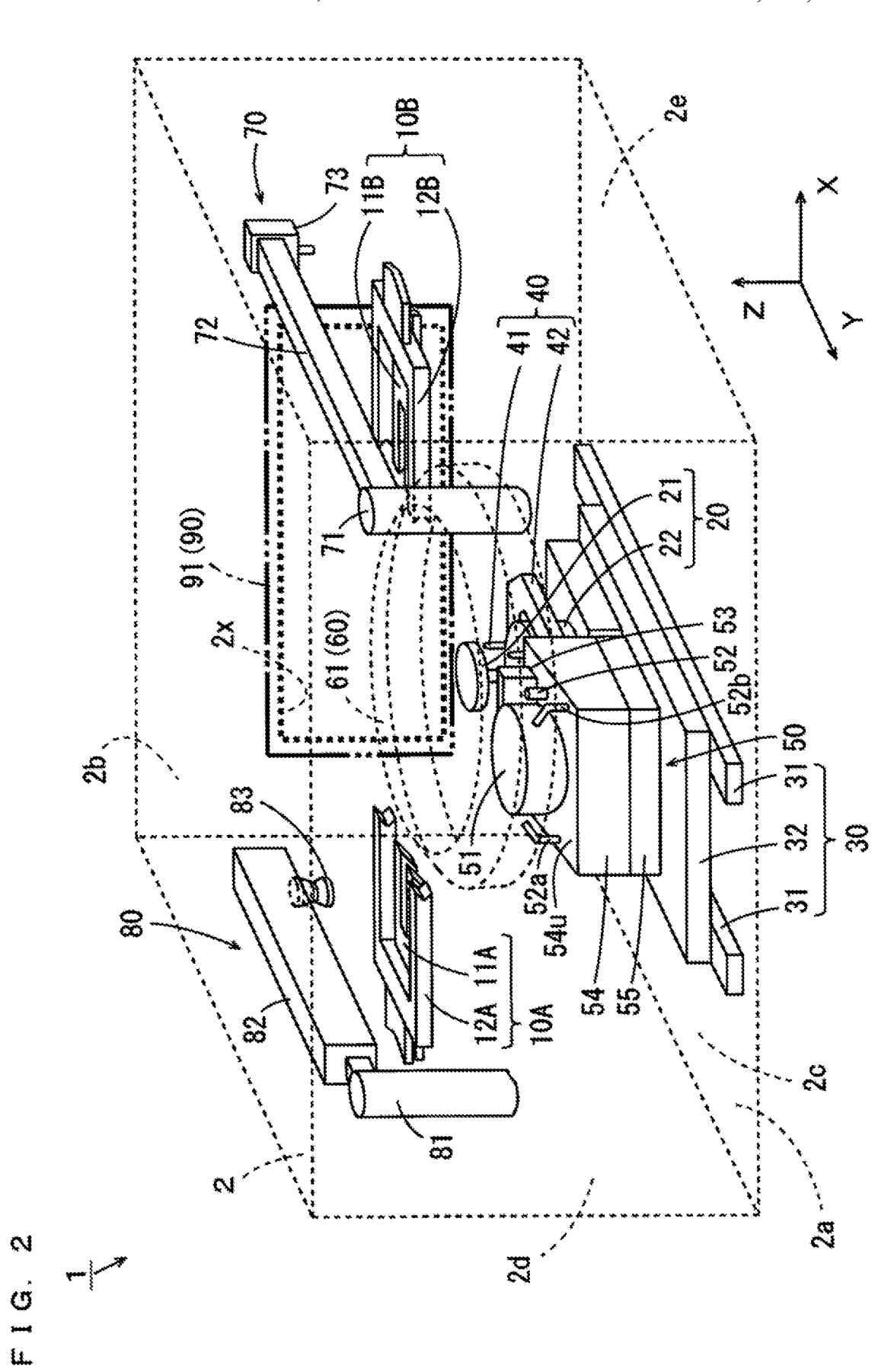
FIG. 2 is an external perspective view showing the inner configuration of the substrate cleaning device of FIG. 1.

FIG. 1 is a schematic plan view of a substrate cleaning device according to a first embodiment of the present invention. FIG. 2 is an external perspective view showing the inner configuration of the substrate cleaning device 1 of FIG. 1. In the substrate cleaning device 1 according to the present embodiment, X, Y and Z directions orthogonal to one another are defined for the clarity of a positional relationship. In FIG. 1 and the subsequent drawings, the X, Y, and Z directions are suitably indicated by arrows. The X and Y directions are orthogonal to each other within a horizontal plane, and the Z direction corresponds to a vertical direction.

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from four sides of the bottom surface portion 2a. The sidewall portions 2b, 2c are opposite to each other, and the sidewall portions 2d, 2e are opposite to each other. A rectangular opening is formed in the center portion of the sidewall portion 2b. This opening is an inlet-outlet port 2x for a substrate W and is used when a substrate W is carried into and carried out from the unit casing 2. In FIG. 2, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

An opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 to open the inlet-outlet port 2x when a substrate W is carried into and carried out from the substrate cleaning device 1. Further, the shutter driver 92 drives the shutter 91 to close the inlet-outlet port 2x when a substrate W is cleaned in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in a plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of a substrate W by suction and is configured to be rotatable about an axis extending in the up-and-down direction (the axis extending in the Z direction). In the following description, a region, that is to be sucked by the suction surface of the suction holder 21, in the lower surface of the substrate W when a substrate W is held by suction by the suction holder 21 is referred to as a lower-surface center region. On the other hand, a region, surrounding the lower-surface center region, in the lower surface of a substrate W is referred to as a lower-surface outer region.

The suction holding driver 22 includes a motor. The motor of the suction holding driver 22 is provided on the mobile base 32 such that its rotation shaft projects upwardly. The suction holder 21 is attached to the upper end portion of the rotation shaft of the suction holding driver 22. Further, in the rotation shaft of the suction holding driver 22, a suction path for holding a substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in a plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts or lowers the pin coupling member 42 on the mobile base 32. Thus, the plurality of support pins 41 are lifted or lowered relative to the suction holder 21.

The lower-surface cleaning device 50 includes a lower-surface brush 51, two liquid nozzles 52, liquid nozzles 52a, 52b, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 2, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 has a circular outer shape in a plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 may be larger than ⅓ of the diameter of a substrate W and smaller than ½ of the diameter of a substrate W. The diameter of a substrate W is 300 mm, for example.

The lower-surface brush 51 has a cleaning surface that can come into contact with the lower surface of a substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface.

Each of the two liquid nozzles 52 is attached to the upper surface 54u of the lifting-lowering supporter 54 to be located in the vicinity of the lower-surface brush 51. Further, each of the two liquid nozzles 52 is attached to the upper surface 54u such that a liquid discharge port is directed upwardly. A lower-surface cleaning liquid supplier 56 (FIG. 3) is connected to the liquid nozzles 52. The lower-surface cleaning liquid supplier 56 supplies a cleaning liquid to the liquid nozzles 52. When a substrate W is cleaned by the lower-surface brush 51, the liquid nozzles 52 discharges the cleaning liquid supplied from the lower-surface cleaning liquid supplier 56 to the lower surface of the substrate W. In the present embodiment, pure water is used as the cleaning liquid to be supplied to the liquid nozzles 52.

Each of the two liquid nozzles 52a, 52b is attached to the upper surface 54u of the lifting-lowering supporter 54 to be located in the vicinity of the lower-surface brush 51. Further, each of the two liquid nozzles 52a, 52b is attached to the upper surface 54u such that a liquid discharge port is directed upwardly. A brush cleaning liquid supplier 57 (FIG. 3) is connected to the liquid nozzles 52a, 52b. The brush cleaning liquid supplier 57 supplies a cleaning liquid to the liquid nozzles 52a, 52b. When the lower-surface brush 51 is cleaned, the liquid nozzles 52a, 52b respectively discharge the cleaning liquid supplied from the brush cleaning liquid supplier 57 to the center portion and the end portion of the cleaning surface of the lower-surface brush 51. In the present embodiment, pure water is used as the cleaning liquid to be supplied to the liquid nozzles 52a, 52b.

The gas injector 53 is a slit-like gas injection nozzle having a gas injection port extending in one direction. The gas injector 53 is attached to the upper surface 54u of the lifting-lowering supporter 54 to be located between the lower-surface brush 51 and the suction holder 21 in a plan view. Further, the gas injector 53 is attached to the upper surface 54u of the lifting-lowering supporter 54 such that a gas injection port is directed upwardly. An injection gas supplier 58 (FIG. 3) is connected to the gas injector 53. An injection gas supplier 58 supplies gas to the gas injector 53. In the present embodiment, an inert gas such as a nitrogen gas is used as the gas to be supplied to the gas injector 53. The gas injector 53 injects the gas supplied from the injection gas supplier 58 to the lower surface of a substrate W when the substrate W is cleaned by the lower-surface brush 51 and when the lower surface of a substrate W is dried, as described below. In this case, a strip-shaped gas curtain extending in the X direction is formed between the lower-surface brush 51 and the suction holder 21.

The lower-surface brush rotation driver 55a includes a motor, and rotates the lower-surface brush 51 when a substrate W is cleaned by the lower-surface brush 51. The lower-surface brush lifting-lowering driver 55b includes a stepping motor or an air cylinder, and lifts or lowers the lifting-lowering supporter 54 with respect to the movement supporter 55. The lower-surface brush movement driver 55c includes a motor, and moves the movement supporter 55 in the Y direction on the mobile base 32. Here, the position of the lower holding device 20 in the mobile base 32 is fixed. Therefore, when being moved by the lower-surface brush movement driver 55c in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position.

The cup device 60 is further provided in the center portion of the bottom surface portion 2a. The cup device 60 includes a cup 61 and a cup driver 62. The cup 61 is provided to surround the lower holding device 20 and the base device 30 in a plan view, and be liftable and lowerable. In FIG. 2, the cup 61 is indicated by the dotted lines. The cup driver 62 moves the cup 61 between a lower cup position and an upper cup position in accordance with which portion of the lower surface of a substrate W is to be cleaned by the lower-surface brush 51. The lower cup position is a height position at which the upper end portion of the cup 61 is located farther downwardly than a substrate W held by suction by the suction holder 21. Further, the upper cup position is a height position at which the upper end portion of the cup 61 is located farther upwardly than the suction holder 21.

At height positions farther upward than the cup 61, the pair of upper holding devices 10A, 10B is provided to be opposite to each other with the base device 30 held therebetween in a plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (the front-and-rear direction) through the center of the suction holder 21 in a plan view, and are provided to be movable in the X direction in a common horizontal plane. Each of the lower chucks 11A, 11B has two support pieces that can be support a lower-surface peripheral portion of a substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the front-and-rear direction) through the center of the suction holder 21 in a plan view, and are provided to be movable in the X direction in a common horizontal plane. Each of the upper chucks 12A, 12B has two holding pieces that are configured to abut against two portions of the outer peripheral end of a substrate W and be capable of holding the outer peripheral end of the substrate W. The upper chuck drivers 14A, 14B move the upper chucks 12A, 12B such that the upper chucks 12A, 12B are closer to each other or farther away from each other.

As shown in FIG. 1, at a position near one side of the cup 61, the upper-surface cleaning device 70 is provided to be located in the vicinity of the upper holding device 10B in a plan view. The upper-surface cleaning device 70 includes a rotation support shaft 71, an arm 72, a spray nozzle 73 and an upper-surface cleaning driver 74.

The rotation support shaft 71 is supported on the bottom surface portion 2a by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 3) is connected to the spray nozzle 73. The upper-surface cleaning fluid supplier 75 supplies the cleaning liquid and gas to the spray nozzle 73. In the present embodiment, pure water is used as the cleaning liquid to be supplied to the spray nozzle 73, and an inert gas such as a nitrogen gas is used as the gas to be supplied to the spray nozzle 73. When the upper surface of the substrate W is cleaned, the spray nozzle 73 mixes the cleaning liquid and the gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts or lowers the rotation support shaft 71, and rotates the rotation support shaft 71. With the above-mentioned configuration, on the upper surface of a substrate W held by suction and rotated by the suction holder 21, the spray nozzle 3 is moved in a circular arc shape. Thus, the entire upper surface of the substrate W can be cleaned.

As shown in FIG. 1, at a position near the other side of the cup 61, the end-portion cleaning device 80 is provided to be located in the vicinity of the upper holding device 10A in a plan view. The end-portion cleaning device 80 includes a rotation support shaft 81, an arm 82, a bevel brush 83 and a bevel brush driver 84.

The rotation support shaft 81 is supported on the bottom surface portion 2a by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of a substrate W can be cleaned with the center portion in the up-and-down direction of the outer peripheral surface.

The bevel brush driver 84 includes one or a plurality of pulse motors, an air cylinder and the like, lifts or lowers the rotation support shaft 81 and rotates the rotation support shaft 81. With the above-mentioned configuration, the center portion of the outer peripheral surface of the bevel brush 83 is brought into contact with the outer peripheral end of a substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of a substrate W is cleaned, a cleaning force of the bevel brush 83 in the outer peripheral end of the substrate W is improved by rotation of the bevel brush 83.

Figure 3:
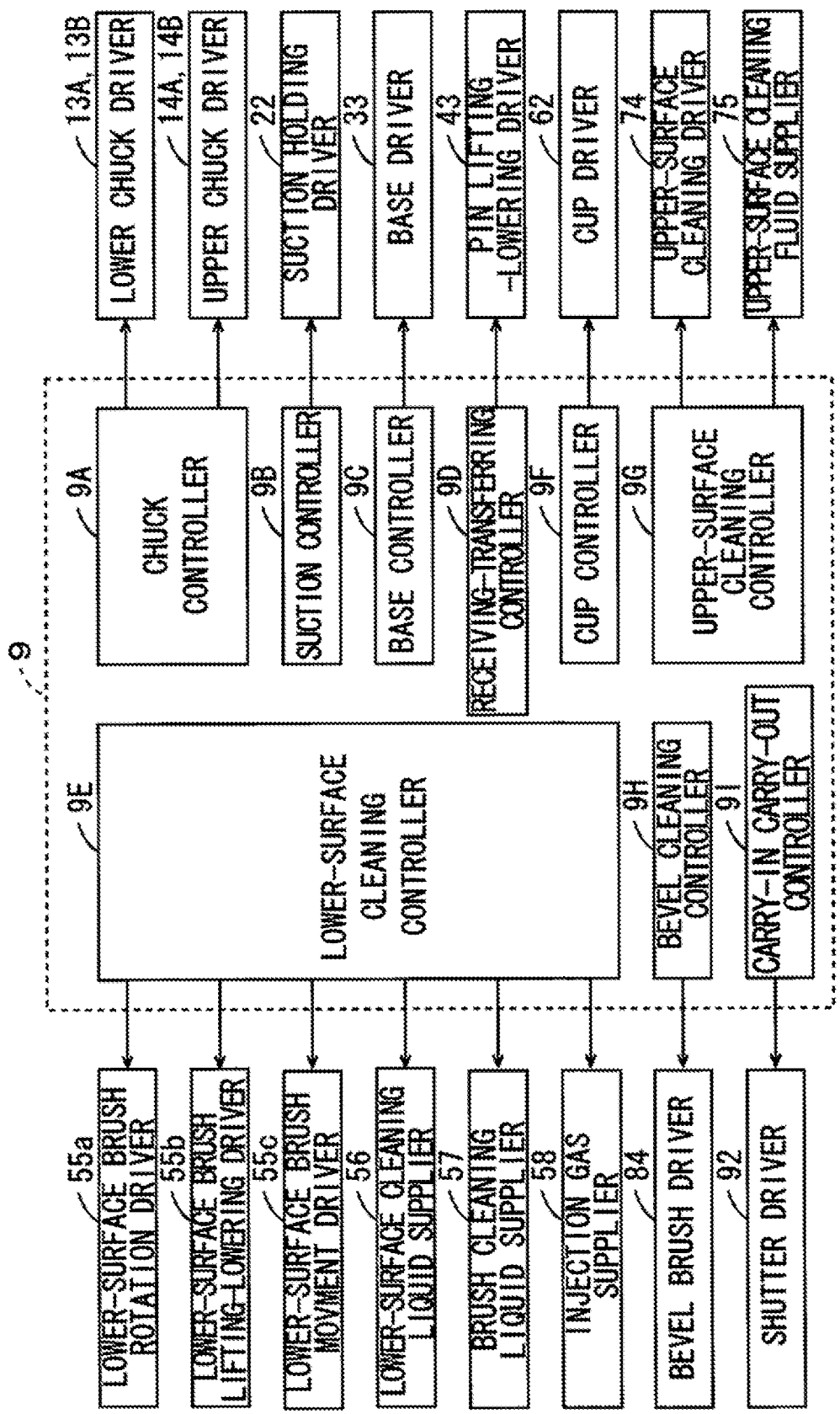
FIG. 3 is a block diagram showing the configuration of a control system of the substrate cleaning device.

FIG. 3 is a block diagram showing the configuration of a control system of the substrate cleaning device 1. A control device 9 of FIG. 3 includes a CPU (Central Processing Unit), a RAM (Random Access Memory), a ROM (Read Only Memory) and a storage device. The RAM is used as a work area for the CPU. The ROM stores a system program. The storage device stores a control program.

As shown in FIG. 3, the control device 9 includes a chuck controller 9A, a suction controller 9B, a base controller 9C, a receiving-transferring controller 9D, a lower-surface cleaning controller 9E, a cup controller 9F, an upper-surface cleaning controller 9G, a bevel cleaning controller 9H and a carry-in carry-out controller 9I as functions. The functions of the control device 9 are implemented by execution of a substrate cleaning program stored in the storage device by the CPU. Part or all of the functions of the control device 9 may be implemented by hardware such as an electronic circuit.

The chuck controller 9A controls the lower chuck drivers 13A, 13B and the upper chuck drivers 14A, 14B in order to receive a substrate W that is carried into the substrate cleaning device 1 and hold the substrate W at a position above the suction holder 1. The suction controller 9B controls the suction holding driver 22 in order to hold a substrate W by suction by the suction holder 21 and rotate the substrate W held by suction.

The base controller 9C controls the base driver 33 in order to move the mobile base 32 with respect to a substrate W held by the upper holding devices 10A, 10B. The receiving-transferring controller 9D controls the pin lifting-lowering driver 43 in order to move a substrate W between a height position of the substrate W held by the upper holding devices 10A, 10B and a height position of the substrate W held by the suction holder 21.

The lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 58 in order to clean the lower surface of a substrate W. Further, the lower-surface cleaning controller 9E controls the brush cleaning liquid supplier 57 to clean the lower-surface brush 51. The cup controller 9F controls the cup driver 62 in order to receive the cleaning liquid splashed from a substrate W using the cup 61 when the substrate W held by the suction by the suction holder 21 is cleaned.

The upper-surface cleaning controller 9G controls the upper-surface cleaning driver 74 and the upper-surface cleaning fluid supplier 75 in order to clean the upper surface of a substrate W held by suction by the suction holder 21. The bevel cleaning controller 9H controls the bevel brush driver 84 in order to clean the outer peripheral end of a substrate W held by suction by the suction holder 21. The carry-in carry-out controller 9I controls the shutter driver 92 in order to open and close the inlet-outlet port 2x of the unit casing 2 when a substrate W is carried into and carried out from the substrate cleaning device 1.

(2) Schematic Operation of Substrate Cleaning Device

FIGS. 4 to 15 are schematic diagrams for explaining the schematic operation of the substrate cleaning device 1 of FIG. 1. In each of FIGS. 4 to 15, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan views in the upper fields and the side views in the middle and bottom fields in order to facilitate understanding of the shape and operation state of each constituent element in the substrate cleaning device 1. Further, in each of FIGS. 14 to 15, the cup 61 is indicated by the two-dots and dash lines, and the outer shape of a substrate W is indicated by the thick one-dot and dash lines.

In an initial state before a substrate W is carried into the substrate cleaning device 1, the inlet-outlet port 2x is closed by the shutter 91 of the opening-closing device 90. Further, as shown in FIG. 1, the lower chucks 11A, 11B are maintained in a state where the distance between the lower chucks 11A, 11B is sufficiently larger than the diameter of the substrate W. Further, the upper chucks 12A, 12B are also maintained in a state where the distance between the upper chucks 12A, 12B is sufficiently larger than the diameter of the substrate W.

Further, the mobile base 32 of the base device 30 is arranged such that the center of the suction holder 21 is located at the center of the cup 61 in a plan view. The lower-surface cleaning device 50 is arranged in the proximal position on the mobile base 32. In the lifting-lowering supporter 54 of the lower-surface cleaning device 50, the cleaning surface (the upper end portion) of the lower-surface brush 51 is located farther downwardly than the suction holder 21. The position of the lower-surface brush 51 in this initial state is referred to as a waiting position. In a state where a substrate W is held by the suction holder 21, the waiting position is below the substrate W.

Further, in the receiving-transferring device 40, the plurality of support pins 41 are located farther downwardly than the suction holder 21. Further, in the cup device 60, the cup 61 is in the lower cup position. In the following description, the center position of the cup 61 in a plan view is referred to as a plane reference position rp. Further, the position of the mobile base 32 located on the bottom surface portion 2a when the center of the suction holder 21 is in the plane reference position rp in a plan view is referred to as a first horizontal position.

Figure 4:
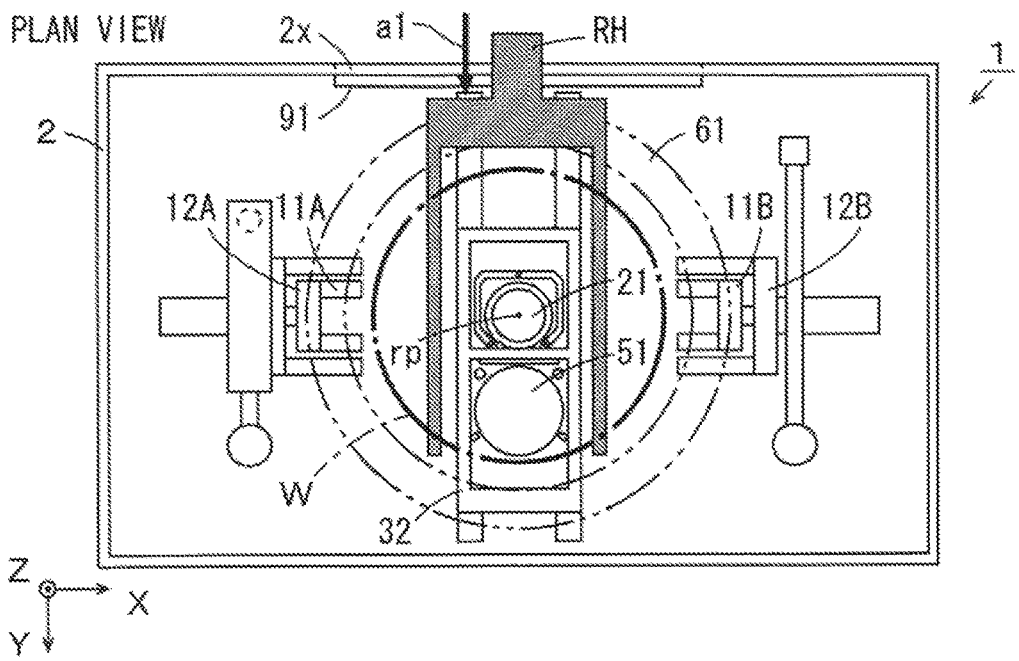
FIG. 4 is a schematic diagram for explaining the schematic operation of the substrate cleaning device of FIG. 1.
Figure 4:
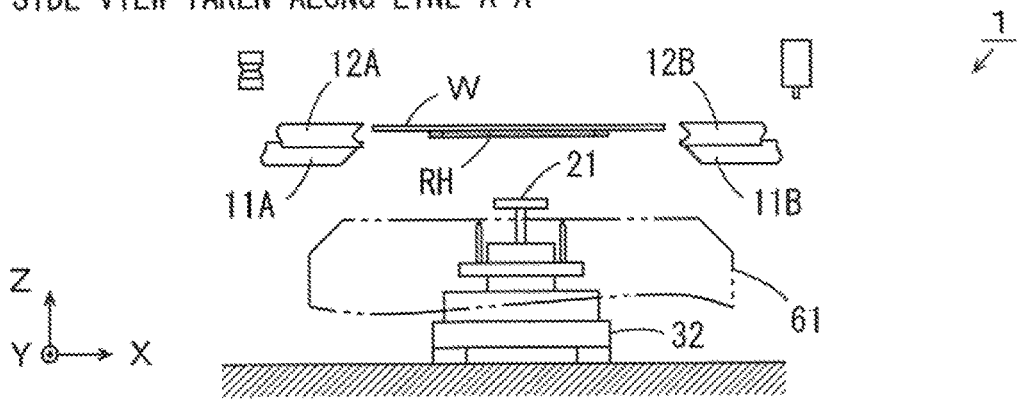
Figure 4:
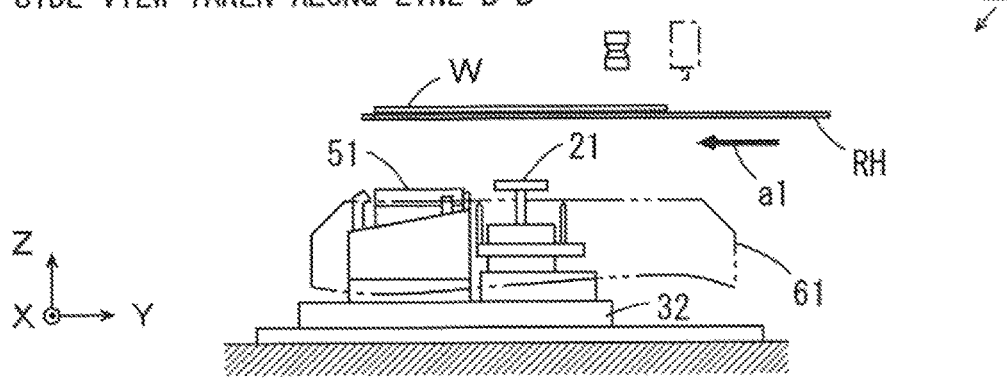

A substrate W is carried into the unit casing 2 of the substrate cleaning device 1. Specifically, the shutter 91 opens the inlet-outlet port 2x immediately before a substrate W is carried in. Thereafter, as indicated by the thick solid arrow a1 in FIG. 4, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 4.

Next, as indicated by the thick solid arrows a2 in FIG. 5, the lower chucks 11A, 11B move closer to each other such that a plurality of support pieces of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces of the lower chucks 11A, 11B. After the hand RH exits, the shutter 91 closes the inlet-outlet port 2x.

Figure 6:
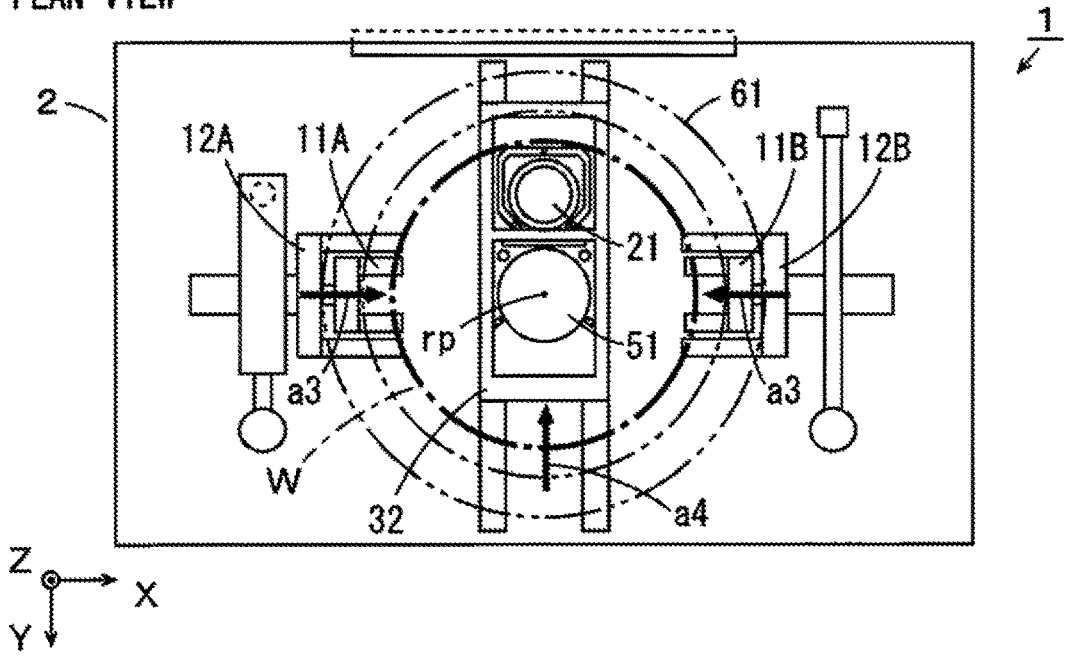
FIG. 6 is a schematic diagram for explaining the schematic operation of the substrate cleaning device of FIG. 1.
Figure 6:
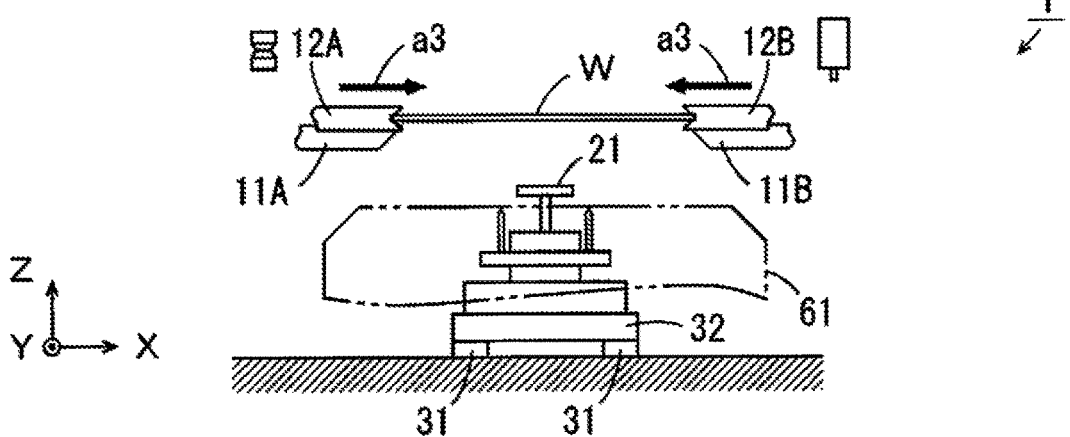
Figure 6:
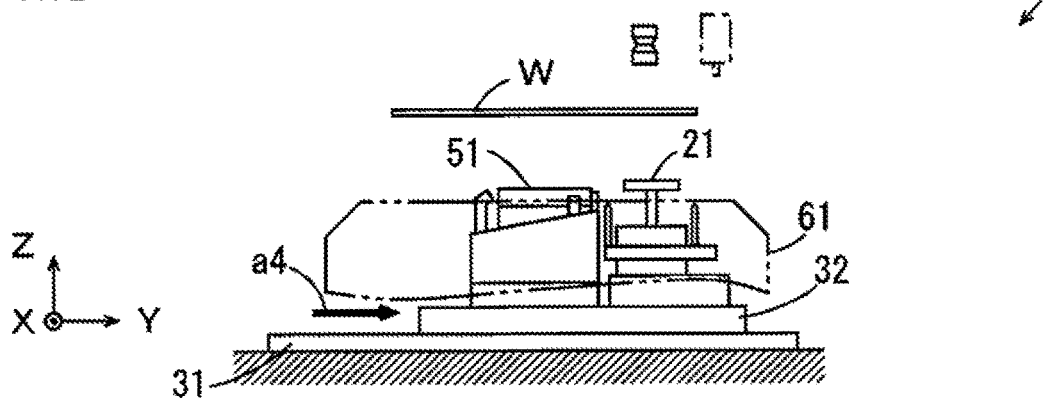

Next, as indicated by the thick solid arrows a3 in FIG. 6, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. Further, as indicated by the thick solid arrow a4 in FIG. 6, the mobile base 32 is moved forwardly from the first horizontal position such that suction holder 21 deviates from the plane reference position rp by a predetermined distance and the center of the lower-surface brush 51 is located at the plane reference position rp. At this time, the position of the mobile base 32 located on the bottom surface portion 2a is referred to as a second horizontal position.

Figure 7:
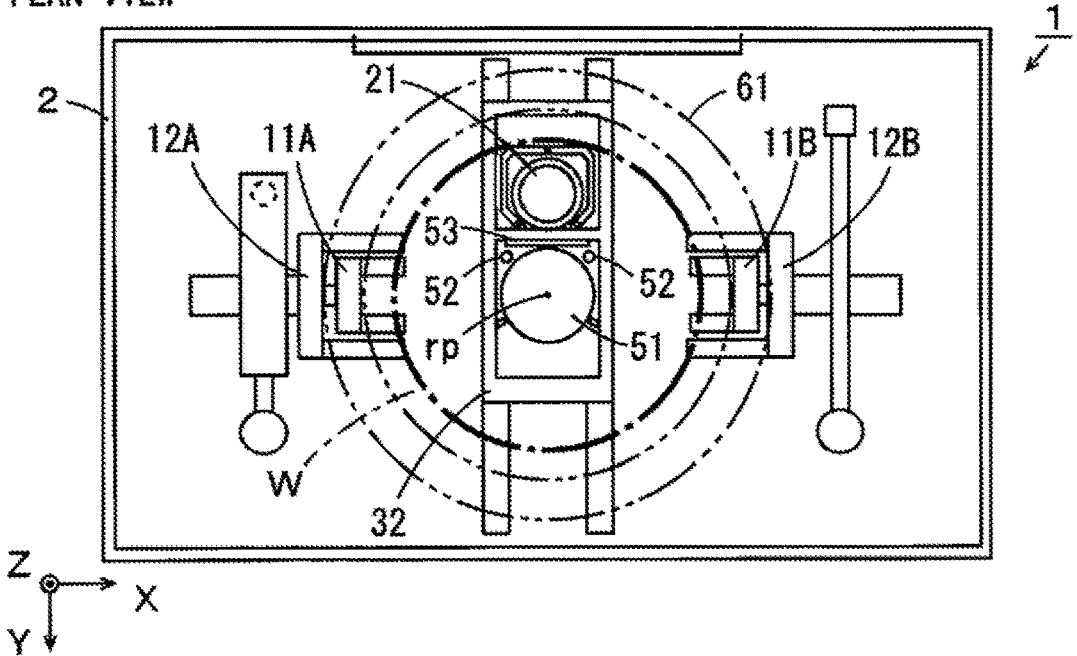
FIG. 7 is a schematic diagram for explaining the schematic operation of the substrate cleaning device of FIG. 1.
Figure 7:
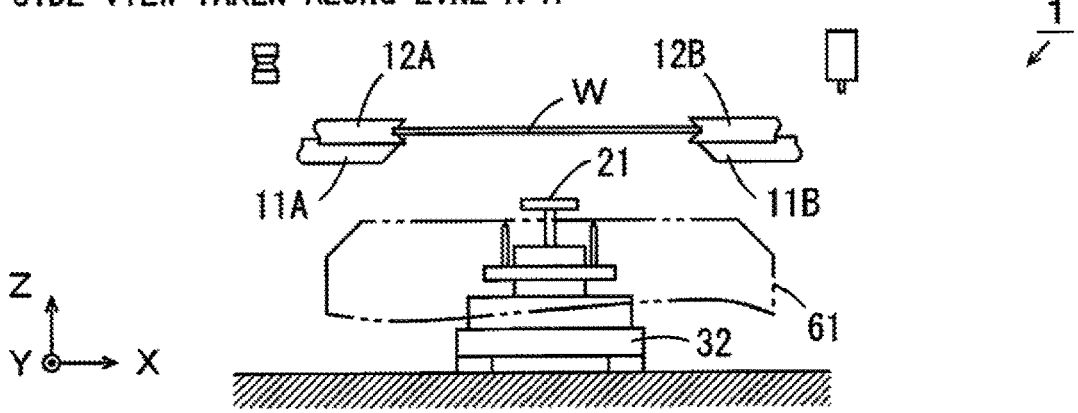
Figure 7:
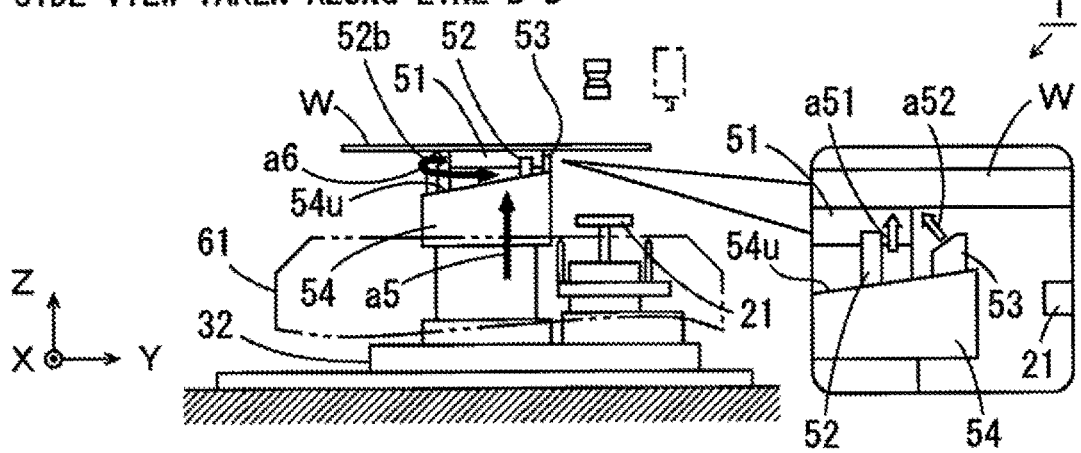

Next, as indicated by the thick solid arrow a5 in FIG. 7, the lifting-lowering supporter 54 is lifted such that the cleaning surface of the lower-surface brush 51 located at the waiting position comes into contact with the lower-surface center region of the substrate W. The position of the lower-surface brush 51 at this time is referred to as a processing position. Further, as indicated by the thick solid arrow a6 in FIG. 7, the lower-surface brush 51 is rotated (spins) about the axis extending in the up-and-down direction. Thus, contaminants adhering to the lower-surface center region of the substrate W are physically stripped by the lower-surface brush 51.

In the bottom field in FIG. 7, an enlarged side view of a portion in which the lower-surface brush 51 comes into contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, as indicated by the outlined arrow a51, the liquid nozzle 52 discharges the cleaning liquid toward the lower surface of the substrate W at a position in the vicinity of the lower-surface brush 51. Thus, the cleaning liquid that has been supplied to the lower surface of the substrate W from the liquid nozzle 52 is guided to a contact portion in which the lower-surface brush 51 and the substrate W are in contact with each other, whereby contaminants that have been removed from the back surface of the substrate W by the lower-surface brush 51 are washed away by the cleaning liquid. In this manner, in the lower-surface cleaning device 50, the liquid nozzle 52 is attached to the lifting-lowering supporter 54 together with the lower-surface brush 51. Thus, the cleaning liquid can be supplied efficiently to a portion to be cleaned in the lower surface of the substrate W by the lower-surface brush 51. Therefore, the consumption of the cleaning liquid is reduced, and excessive splashing of the cleaning liquid is suppressed.

Here, the upper surface 54u of the lifting-lowering supporter 54 is inclined downwardly in a direction away from the suction holder 21. In this case, in a case in which the cleaning liquid including contaminants falls on the lifting-lowering supporter 54 from the lower surface of the substrate W, the cleaning liquid received by the upper surface 54u is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 7. In the present embodiment, the gas injector 53 is attached onto the lifting-lowering supporter 54 such that the gas injection port extends in the X direction. In this case, when gas is injected to the lower surface of the substrate W from the gas injector 53, a strip-shaped curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 7, the present invention is not limited to this. The gas injector 53 may inject gas in the Z direction toward the lower surface of the substrate W from the gas injector 53.

Next, in the state of FIG. 7, when the cleaning of the lower-surface center region of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance. Further, discharging of the cleaning liquid from the liquid nozzle 52 to the substrate W is stopped. At this time, the injection of gas from the gas injector 53 to the substrate W continues.

Figure 8:
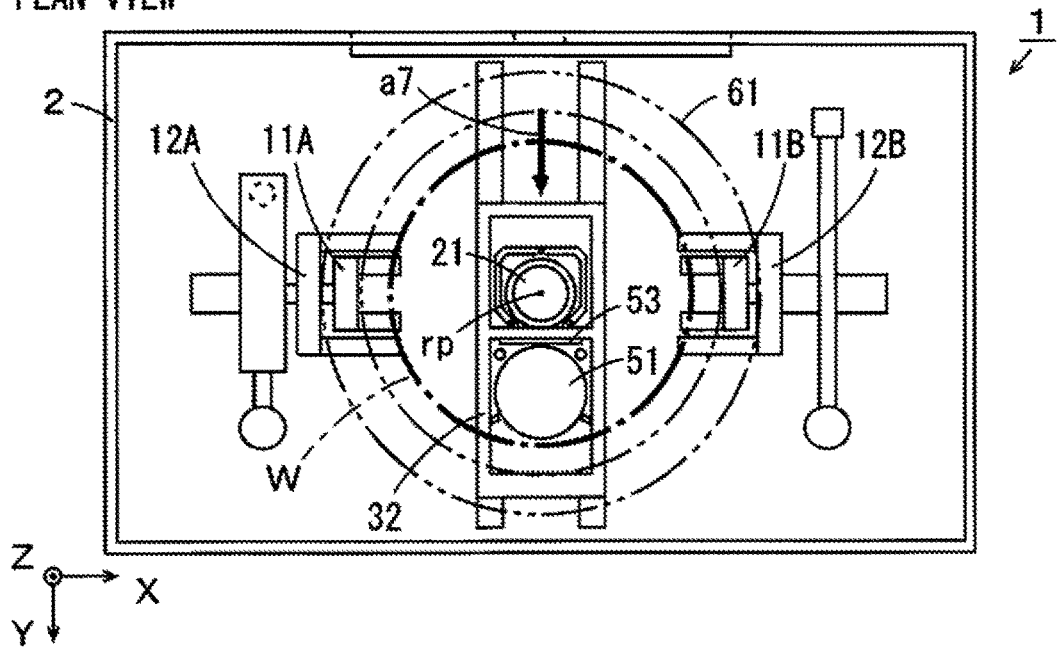
FIG. 8 is a schematic diagram for explaining the schematic operation of the substrate cleaning device of FIG. 1.
Figure 8:
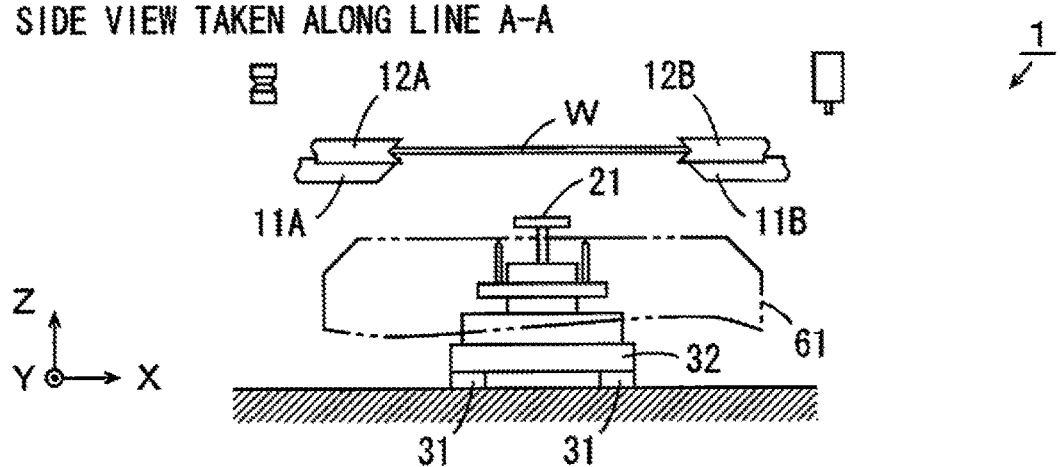
Figure 8:
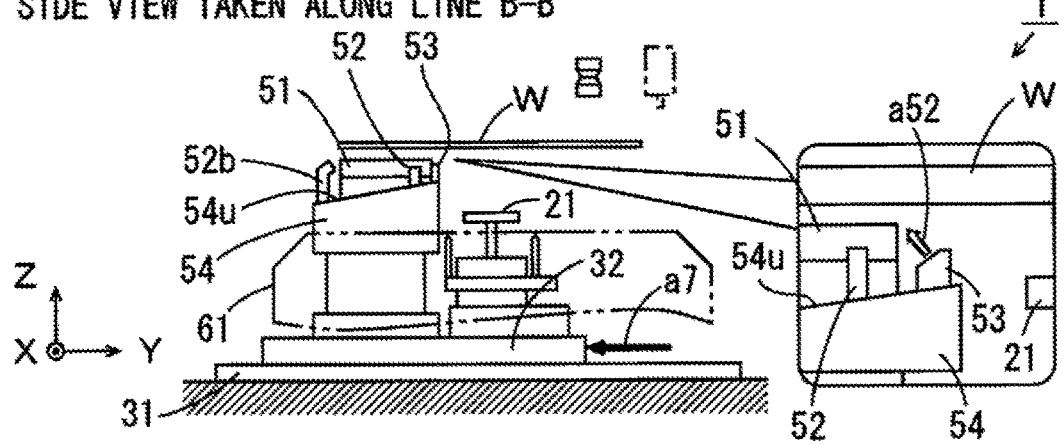

Thereafter, as indicated by the thick solid arrow a7 in FIG. 8, the mobile base 32 is moved rearwardly such that the suction holder 21 is located at the plane reference position rp. That is, the mobile base 32 is moved from the second horizontal position to the first horizontal position. At this time, the injection of gas from the gas injector 53 to the substrate W continues, so that the lower-surface center region of the substrate W is sequentially dried by the gas curtain.

Figure 9:
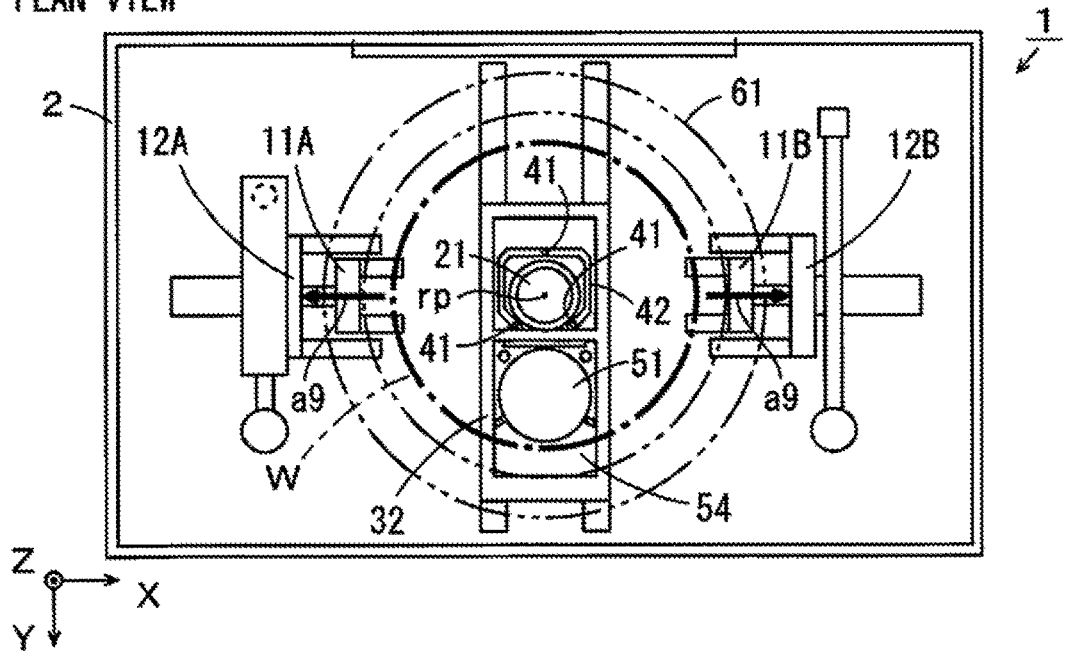
FIG. 9 is a schematic diagram for explaining the schematic operation of the substrate cleaning device of FIG. 1.
Figure 9:
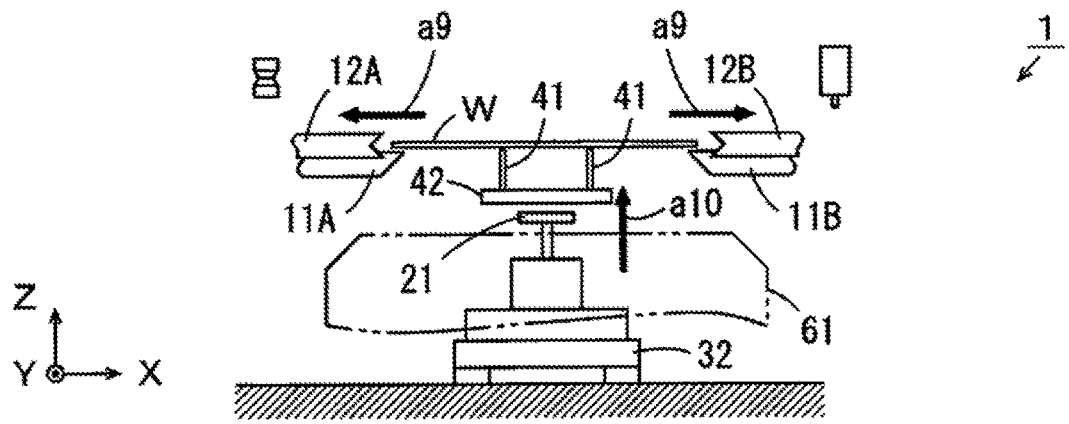
Figure 9:
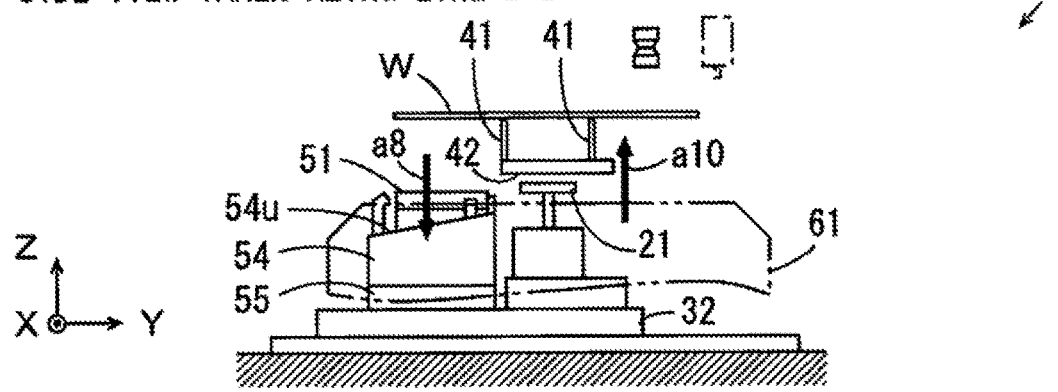

Next, as indicated by the thick solid arrow a8 in FIG. 9, the lifting-lowering supporter 54 is lowered such that the cleaning surface of the lower-surface brush 51 is located at a position farther downward than the suction surface (upper end portion) of the suction holder 21. Thus, the lower-surface brush 51 moves to the waiting position. Further, as indicated by the thick solid arrows a9 in FIG. 9, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 9, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Figure 10:
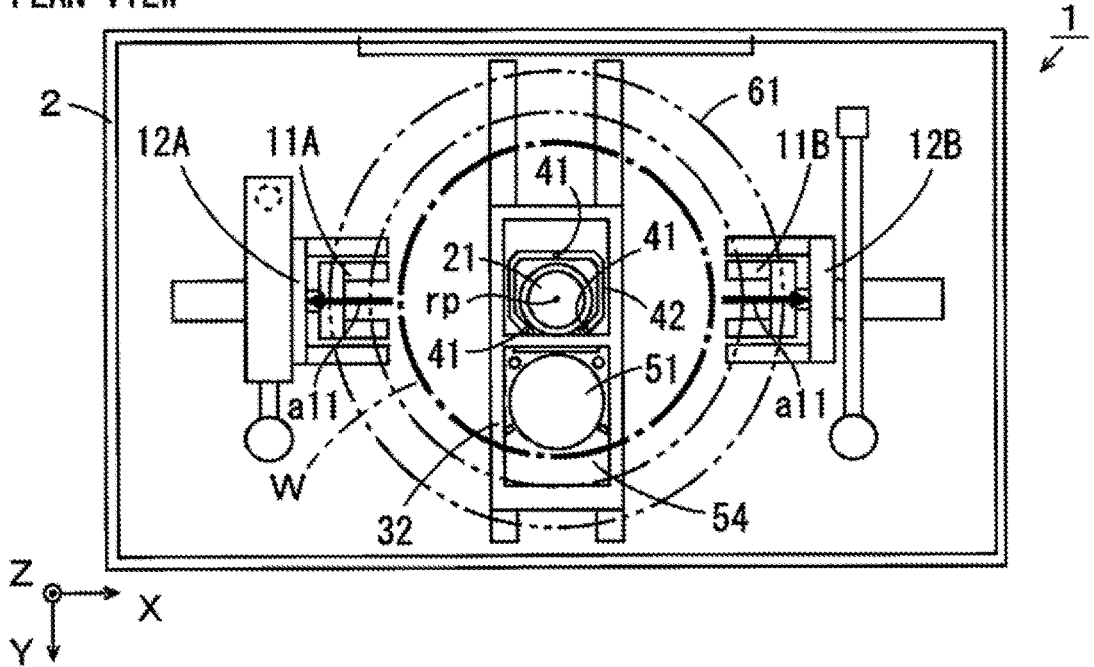
FIG. 10 is a schematic diagram for explaining the schematic operation of the substrate cleaning device of FIG. 1.
Figure 10:
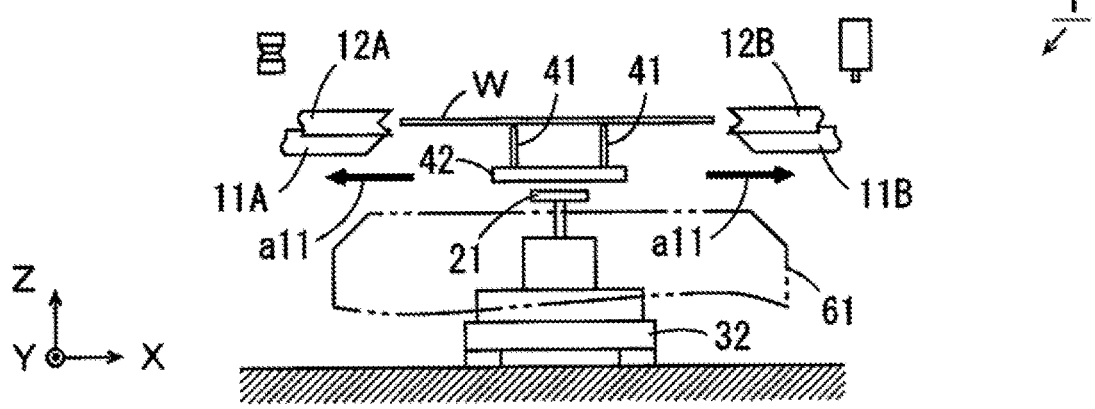
Figure 10:
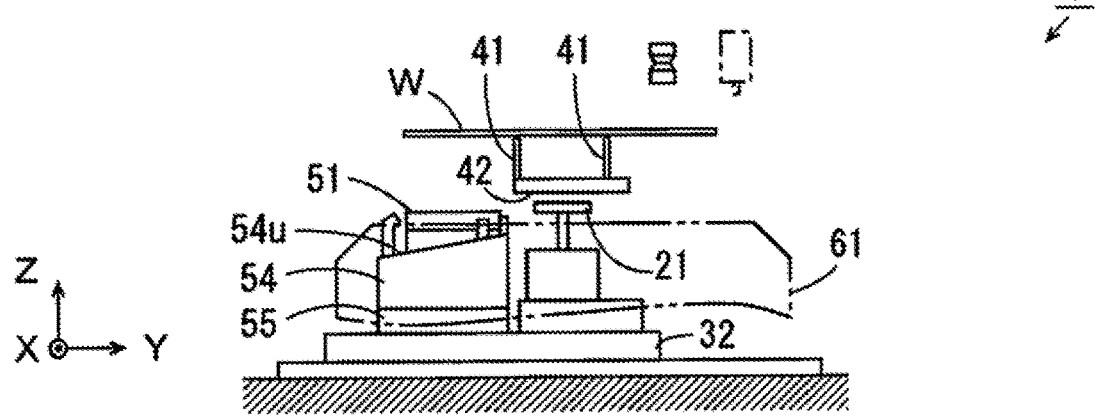

Next, as indicated by the thick solid arrows a11 in FIG. 10, the lower chucks 11A, 11B move away from each other. At this time, the lower chucks 11A, 11B move to positions at which the lower chucks 11A, 11B do not overlap with the substrate W supported by the plurality of support pins 41 in a plan view. Thus, both of the upper holding devices 10A, 10B return to the initial state.

Figure 11:
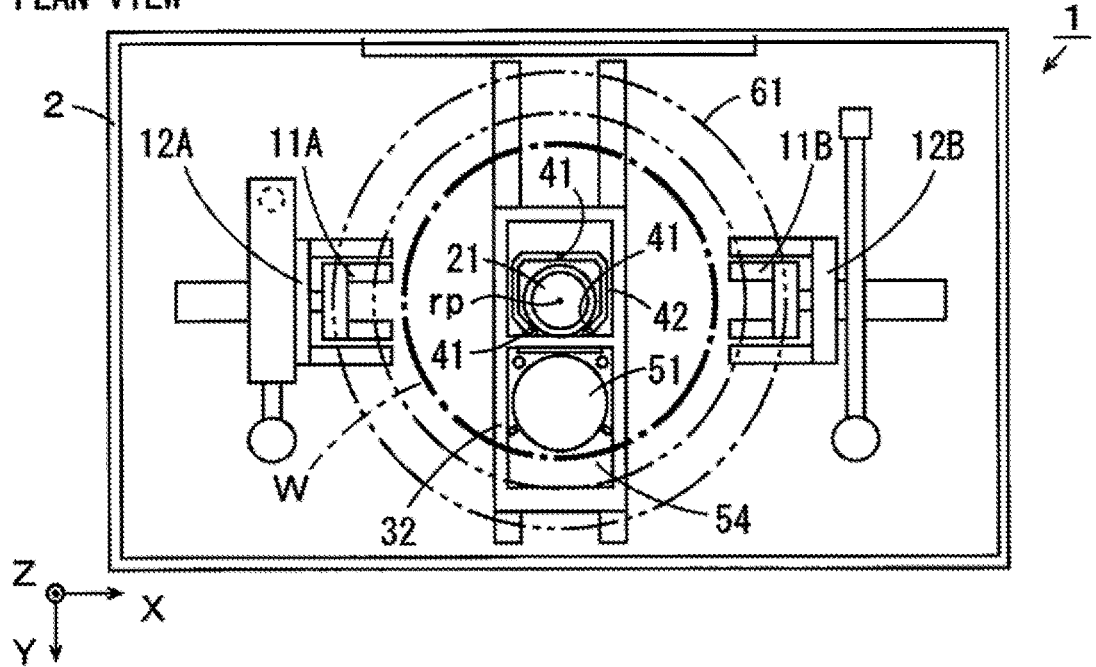
FIG. 11 is a schematic diagram for explaining the schematic operation of the substrate cleaning device of FIG. 1.
Figure 11:
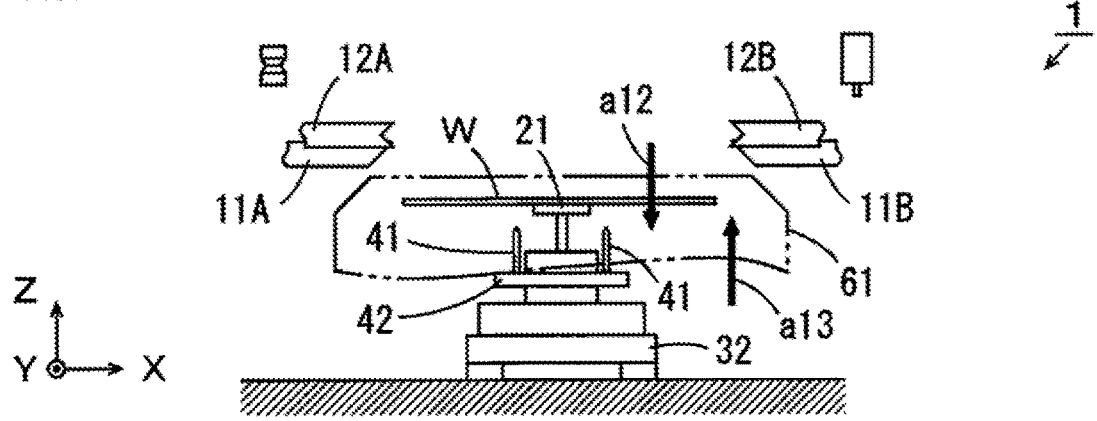
Figure 11:
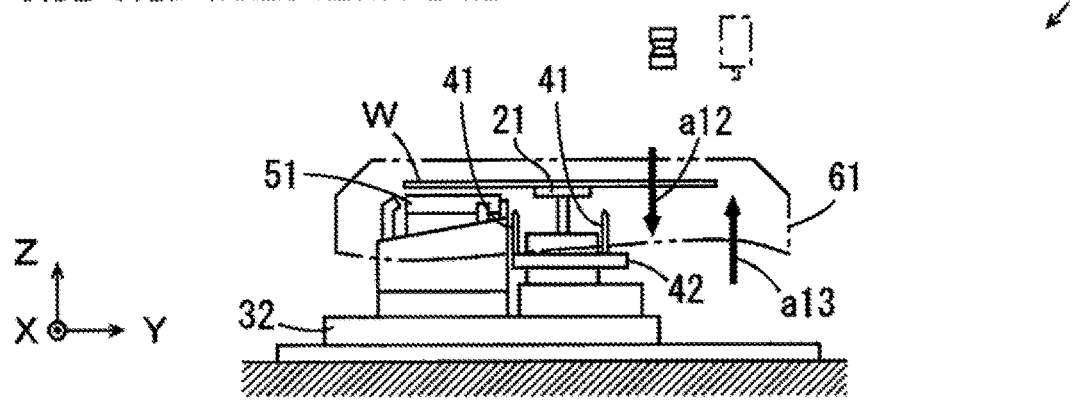

Next, as indicated by the thick solid arrow a12 in FIG. 11, the pin coupling member 42 is lowered such that the upper end portions of the plurality of support pins 41 are located at positions farther downward than the suction holder 21. Thus, the substrate W supported on the plurality of support pins 41 is received by the suction holder 21. In this state, the suction holder 21 holds the lower-surface center region of the substrate W by suction. At the same time as the pin coupling member 42 is lowered or after the pin coupling member 42 is lowered, the cup 61 is lifted from the lower cup position to the upper cup position as indicated by the thick solid arrow a13 in FIG. 11.

Figure 12:
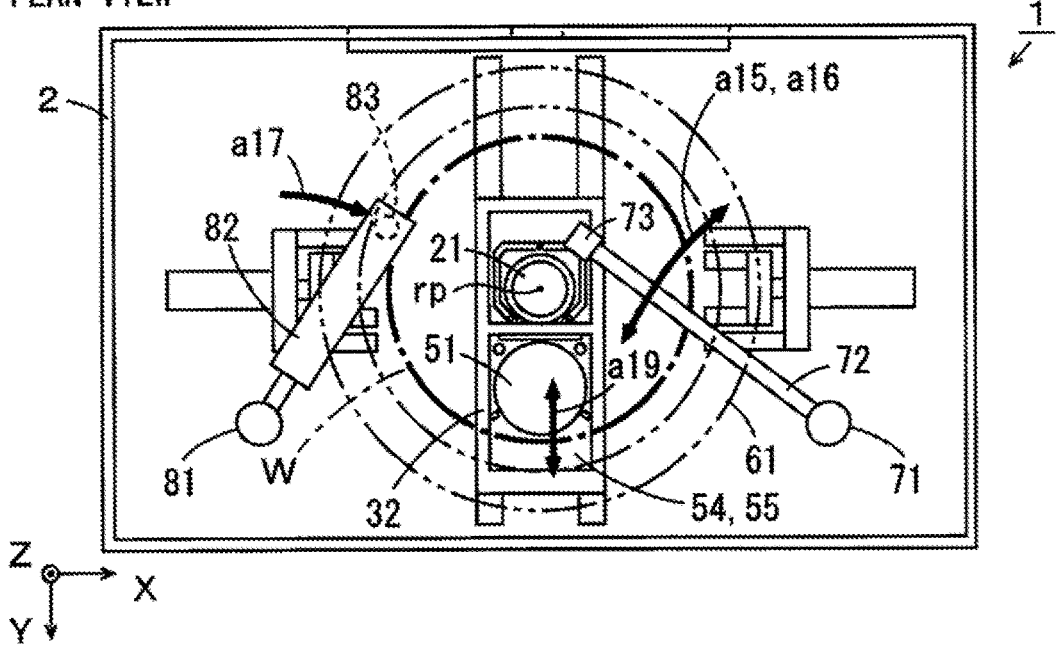
FIG. 12 is a schematic diagram for explaining the schematic operation of the substrate cleaning device of FIG. 1.
Figure 12:
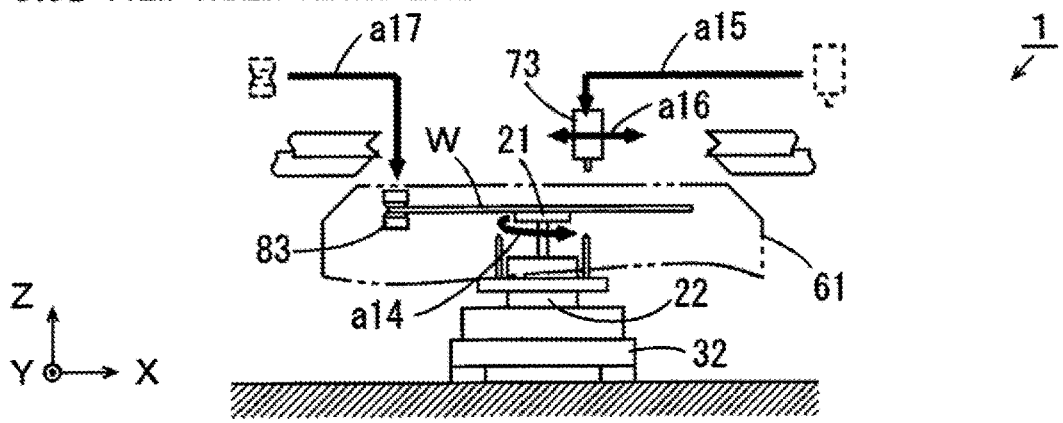
Figure 12:
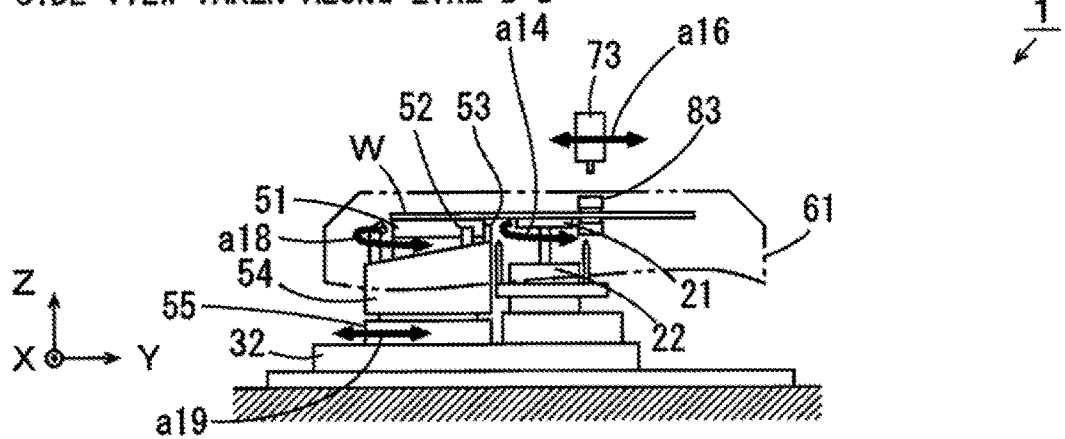

Next, as indicated by the thick solid arrow a14 in FIG. 12, the suction holder 21 rotates about the axis extending in the up-and-down direction (an axial center of the rotation shaft of the suction holding driver 22). Thus, the substrate W held by suction by the suction holder 21 is rotated in a horizontal attitude.

Next, the rotation support shaft 71 of the upper-surface cleaning device 70 is rotated and lowered. Thus, as indicated by the thick solid arrow a15 in FIG. 12, the spray nozzle 73 is moved to a position above the substrate W, and the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Thus, as indicated by the thick solid arrow a16 in FIG. 12, the spray nozzle 73 moves above the rotating substrate W. The fluid mixture is injected to the entire upper surface of the substrate W, so that the entire upper surface of the substrate W is cleaned.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 12, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. The contaminants that have been stripped from the outer peripheral end of the substrate W are washed away by the cleaning liquid of the fluid mixture injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 located at the waiting position comes into contact with the lower-surface outer region of the substrate W. Thus, the lower-surface brush 51 moves to the processing position. Further, as indicated by the thick solid arrow a18 in FIG. 12, the lower-surface brush 51 is rotated (spins) about the axis extending in the up-and-down direction. Further, the liquid nozzle 52 discharges the cleaning liquid toward the lower surface of the substrate W, and the gas injector 53 injects gas toward the lower surface of the substrate W. Thus, it is possible to clean the entire lower-surface outer region of the substrate W held by suction and rotated by the suction holder 21 using the lower-surface brush 51.

The rotation direction of the lower-surface brush 51 may be opposite to the rotation direction of the suction holder 21. In this case, the entire lower-surface outer region of the substrate W can be cleaned efficiently. In a case in which the lower-surface brush 51 is not relatively large, the movement supporter 55 may advance and retreat between the proximal position and the distal position on the mobile base 32 as indicated by the thick solid arrow a19 in FIG. 12. Also in this case, it is possible to clean the entire lower-surface outer region of the substrate W held by suction and rotated by the suction holder 21 using the lower-surface brush 51.

While it requires a relatively long period of time to clean the upper surface of the substrate W with use of the spray nozzle 73 in the present embodiment, it is possible to clean the lower-surface outer region of the substrate W using the relatively large lower-surface brush 51 in a relatively short period of time. As such, during a period in which the upper surface of the substrate W is cleaned, cleaning of the lower-surface outer region of the substrate W with use of the above-mentioned lower-surface brush 51 and cleaning of the lower-surface brush 51 with use of the liquid nozzles 52a, 52b of FIG. 1 are alternately performed. Details of an operation of cleaning the lower-surface brush 51 in FIG. 12 will be described below.

Next, when cleaning of the upper surface, the outer peripheral end and the lower-surface outer region of the substrate W is completed, injection of the fluid mixture from the spray nozzle 73 to the substrate W is stopped. Further, as indicated by the thick solid arrow a20 in FIG. 13, the spray nozzle 73 is moved to a position near one side of the cup 61 (the position in the initial state). Further, as indicated by the thick solid arrow a21 in FIG. 13, the bevel brush 83 is moved to a position near the other side of the cup (the position in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Thus, the lower surface brush 51 moves to the waiting position. Further, the discharging of the cleaning liquid from the liquid nozzle 52 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Figure 14:
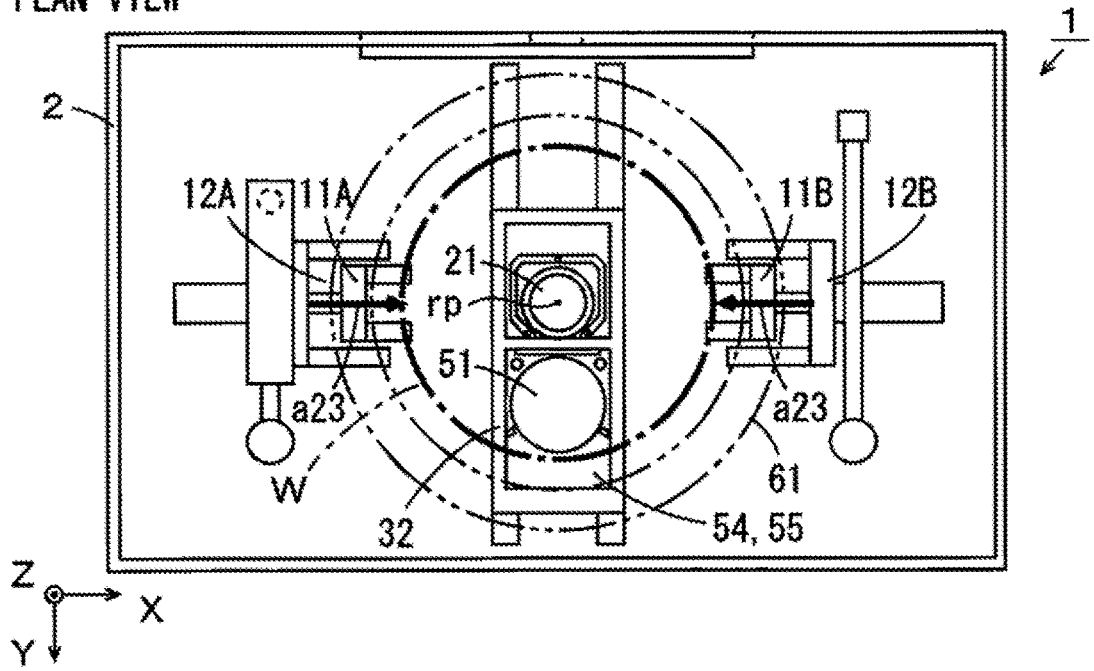
FIG. 14 is a schematic diagram for explaining the schematic operation of the substrate cleaning device of FIG. 1.
Figure 14:
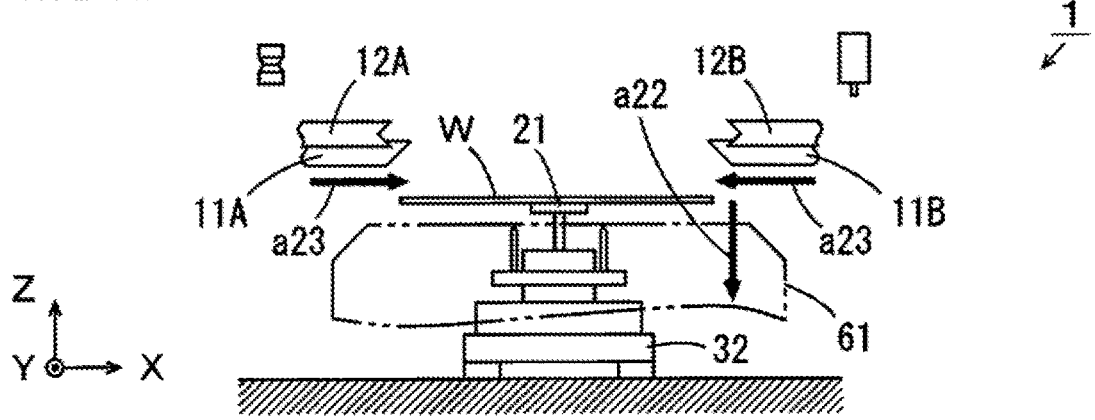
Figure 14:
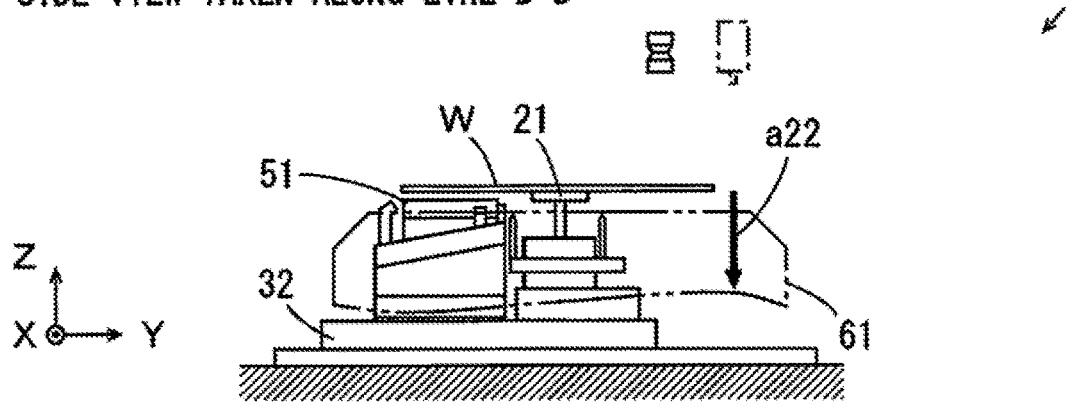
Figure 15:
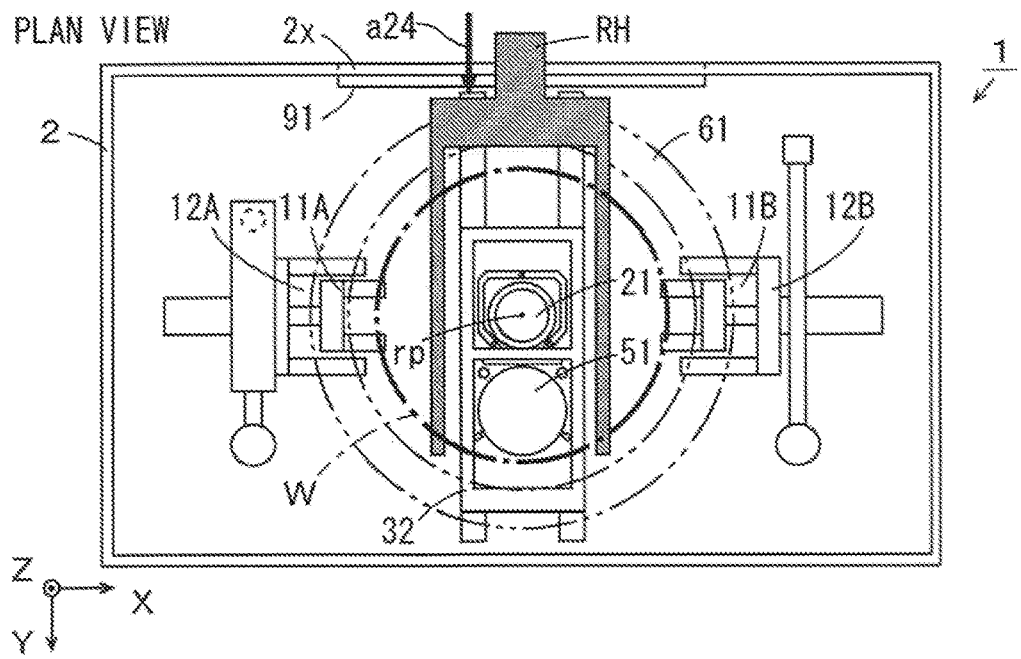
FIG. 15 is a schematic diagram for explaining the schematic operation of the substrate cleaning device of FIG. 1.
Figure 15:
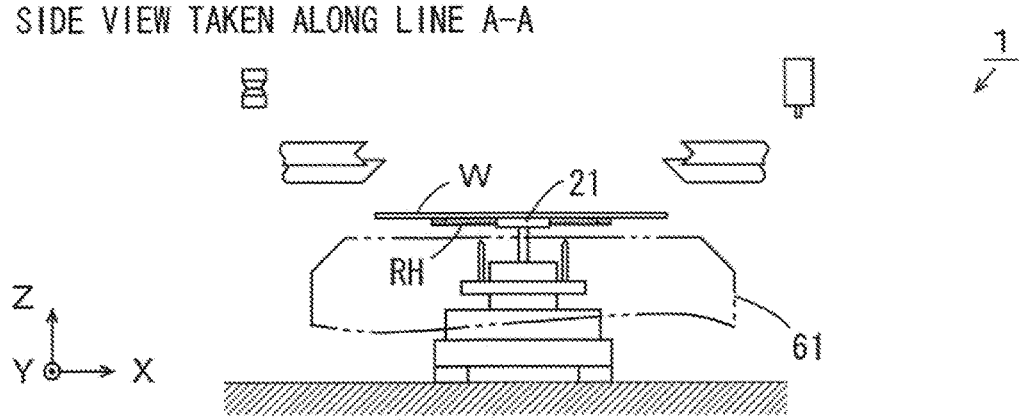
Figure 15:
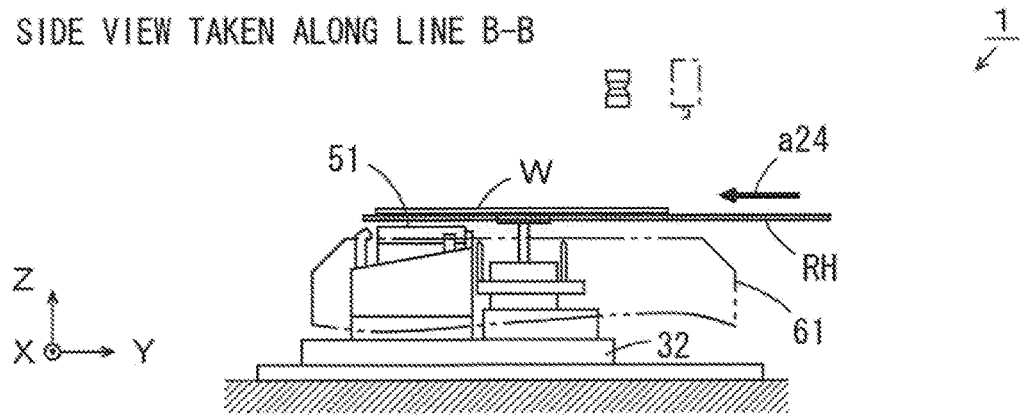

Next, as indicated by the thick solid arrow a22 in FIG. 14, the cup 61 is lowered from the upper cup position to the lower cup position. Further, as indicated by the thick solid arrows a23 in FIG. 14, the lower chucks 11A, 11B move closer to each other to positions at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2x immediately before the substrate W is carried out. Thereafter, as indicated by the thick solid arrow a24 in FIG. 15, the hand (substrate holder) RH of the substrate transporting robot (not shown) enters the unit casing 2 through the inlet-outlet port 2x. Subsequently, the hand RH receives the substrate W on the suction holder 21 and exits from the inlet-outlet port 2x. After the hand RH exits, the shutter 91 closes the inlet-outlet port 2x.

(3) Operation of Cleaning Lower-Surface Brush

Figure 16:
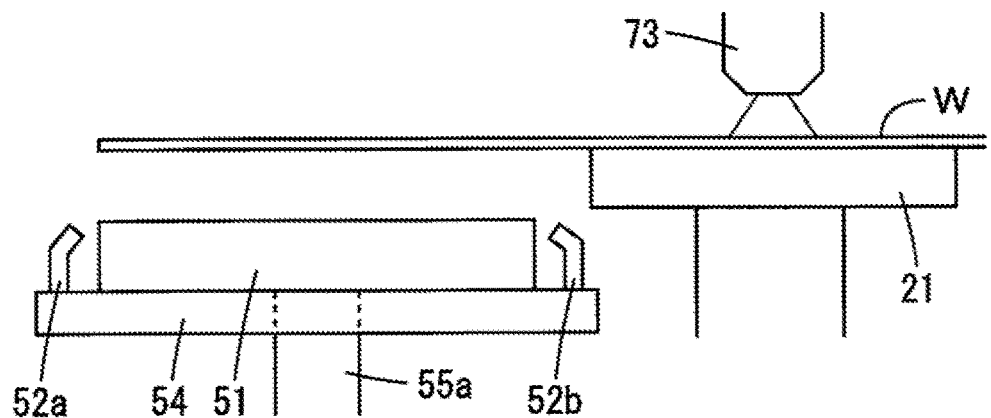
FIG. 16 is a schematic diagram for explaining the schematic operation of the substrate cleaning device in FIG. 12.

FIGS. 16 to 21 are schematic diagrams for explaining the schematic operation of the substrate cleaning device 1 in FIG. 12. As shown in FIG. 16, when the upper surface of the substrate W of FIG. 12 is cleaned, the suction holder 21 rotates about the axis extending in the up-and-down direction while holding the substrate W by suction, and the spray nozzle 73 is moved to a position substantially above the center of the substrate W. In this state, the fluid mixture of the cleaning liquid and gas is injected from the spray nozzle 73 to the upper surface of the substrate W.

Further, cleaning of the outer peripheral end of the substrate W with use of the bevel brush 83 of FIG. 12 is started. At this time, suppose that the contamination rate of the lower-surface outer region of the substrate W is 100%, and the contamination rate of the lower-surface brush 51 is 0%. Here, a contamination rate is an index that indicates how low cleanliness is. A high contamination rate means low cleanliness.

Figure 17:
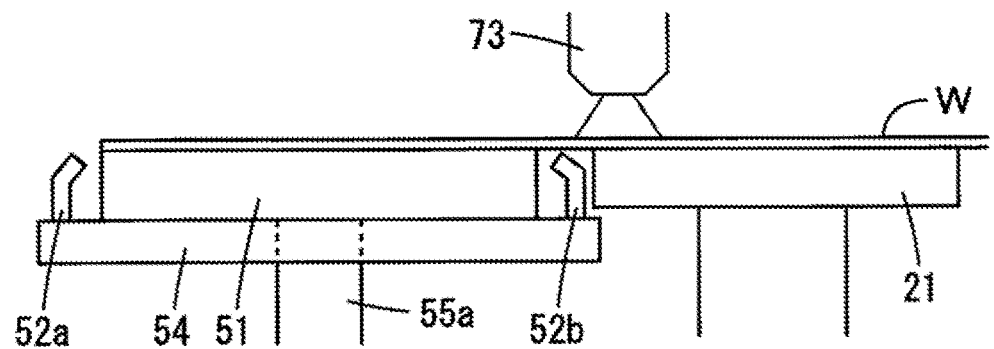
FIG. 17 is a schematic diagram for explaining the schematic operation of the substrate cleaning device in FIG. 12.

Next, as shown in FIG. 17, the spray nozzle 73 is moved outwardly above the rotating substrate W. This movement of the spray nozzle 73 continues until the spray nozzle 73 arrives at a position above the outer periphery of the substrate W. Further, the lower-surface brush 51 is lifted from the waiting position to the processing position above the waiting position while rotating such that the cleaning surface of the lower-surface brush 51 comes into contact with the lower-surface outer region of the substrate W. Further, the cleaning liquid is discharged to the lower surface of the substrate W from the liquid nozzle 52 of FIG. 12. Thus, the lower-surface outer region of the substrate W is cleaned. When the lower-surface outer region of the substrate W is cleaned, gas is injected from the gas injector 53 of FIG. 12 toward the lower surface of the substrate W.

Suppose that contaminants equivalent to the contamination rate of 60%, for example, are transferred to the lower-surface brush 51 in the operation of cleaning the lower-surface outer region of the substrate W of FIG. 17. Further, suppose that contaminants equivalent to contamination rate of 20%, for example, out of the contaminants that have adhered to the substrate W are washed away by the cleaning liquid. In this case, the contamination rate of the lower-surface outer region of the substrate W decreases to 20%, and the contamination rate of the lower-surface brush 51 increases to 60%.

Figure 18:
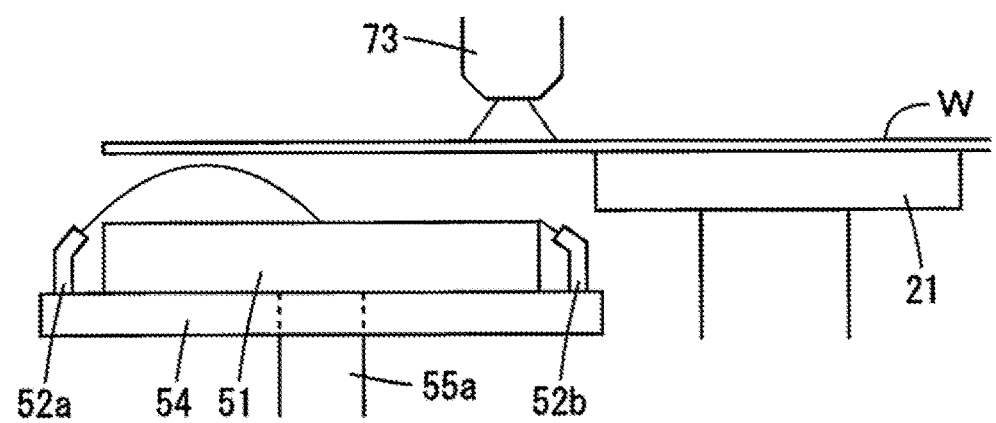
FIG. 18 is a schematic diagram for explaining the schematic operation of the substrate cleaning device in FIG. 12.

Next, as shown in FIG. 18, the lower-surface brush 51 is lowered from the processing position to the waiting position below the processing position while rotating such that the cleaning surface of the lower-surface brush 51 is spaced apart from the lower-surface outer region of the substrate W. Further, at the waiting position, the cleaning liquid is discharged toward the center portion of the cleaning surface of the lower-surface brush 51 from the liquid nozzle 52a, and the cleaning liquid is discharged from the liquid nozzle 52b to the end portion of the cleaning surface of the lower-surface brush 51. Thus, the lower-surface brush 51 is cleaned. In the present example, the cleaning liquid that has discharged from the liquid nozzle 52a is supplied to the center portion of the cleaning surface of the lower-surface brush 51 from an obliquely parabolically upward position. Ultrasonic cleaning may be combined to clean the lower-surface brush 51.

Suppose that, in the operation of cleaning the lower-surface brush 51 of FIG. 18, contaminants equivalent to the contamination rate of 20%, for example, out of the contaminants that have adhered to the lower-surface brush 51 are washed away by the cleaning liquid. In this case, the contamination rate of the lower-surface outer region of the substrate W remains at 20%, and the contamination rate of the lower-surface brush 51 decreases to 40%.

Figure 19:
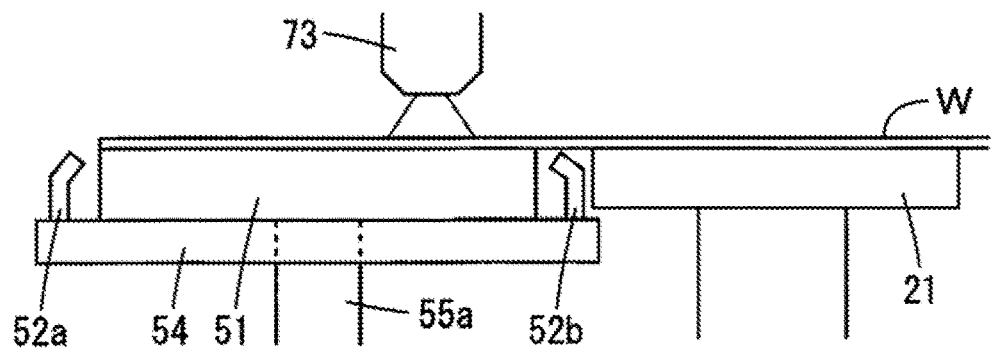
FIG. 19 is a schematic diagram for explaining the schematic operation of the substrate cleaning device in FIG. 12.

Subsequently, as shown in FIG. 19, the lower-surface brush 51 is lifted from the waiting position to the processing position above the waiting position while rotating such that the cleaning surface of the lower-surface brush 51 comes into contact with the lower-surface outer region of the substrate W. Thus, the lower-surface outer region of the substrate W is cleaned again. The operation of cleaning the lower-surface outer region of the substrate W in FIG. 19 is similar to the operation of cleaning the lower-surface outer region of the substrate W in FIG. 17.

In the operation of cleaning the lower-surface outer region of the substrate W of FIG. 19, contaminants are transferred between the lower-surface outer region of the substrate W and the lower-surface brush 51. However, as a current point in time, the contamination rate of the lower-surface brush 51 is higher than the contamination rate of the lower-surface outer region of the substrate W. Therefore, an amount of contaminants to be transferred from the lower-surface brush 51 to the lower-surface outer region of the substrate W is larger than an amount of contaminants to be transferred from the lower-surface outer region of the substrate W to the lower-surface brush 51. Therefore, the contaminants that have adhered to the lower-surface brush 51 are virtually transferred to the lower-surface outer region of the substrate W.

Suppose that contaminants equivalent to the contamination rate of 20%, for example, out of the contaminants that have adhered to the lower-surface brush 51 are transferred to the lower-surface outer region of the substrate W. Further, suppose that contaminants equivalent to the contamination rate of 20%, for example, are washed away by the cleaning liquid. In this case, the contamination rate of the lower-surface outer region of the substrate W remains at 20%, and the contamination rate of the lower-surface brush 51 decreases to 20%.

Figure 20:
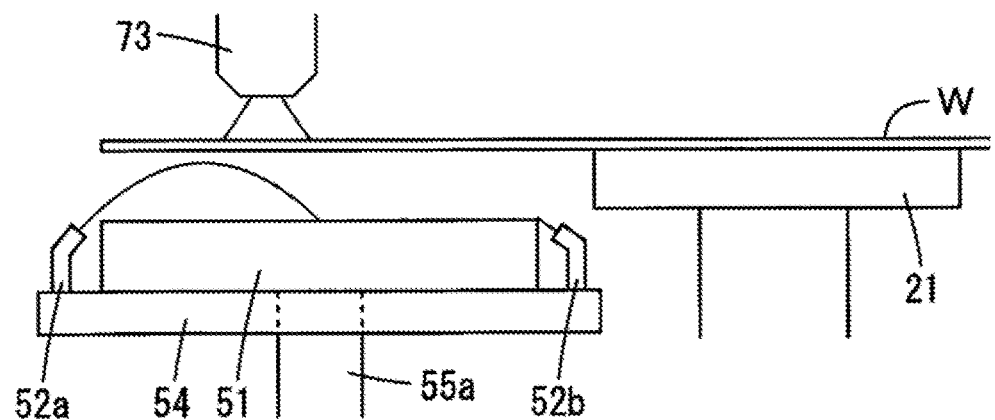
FIG. 20 is a schematic diagram for explaining the schematic operation of the substrate cleaning device in FIG. 12.

Thereafter, as shown in FIG. 20, the lower-surface brush 51 is lowered from the processing position to the waiting position below the processing position while rotating such that the cleaning surface of the lower-surface brush 51 moves away from the lower-surface outer region of the substrate W. Thus, the lower-surface brush 51 is cleaned again. The operation of cleaning the lower-surface brush 51 in FIG. 20 is similar to the operation of cleaning the lower-surface brush 51 in FIG. 18.

Suppose that, in the operation of cleaning the lower-surface brush 51 of FIG. 20, contaminants equivalent to the contamination rate of 20%, for example, out of the contaminants that have adhered to the lower-surface brush 51 are washed away by the cleaning liquid. In this case, the contamination rate of the lower-surface outer region of the substrate W remains at 20%, and the contamination rate of the lower-surface brush 51 decreases to 0%.

The operation of cleaning the lower-surface outer region of the substrate W in FIG. 19 and the operation of cleaning the lower-surface brush 51 in FIG. 20 are repeated. In this case, in the operation of cleaning the lower-surface outer region of the substrate W, contaminants are transferred between the lower-surface outer region of the substrate W and the lower-surface brush 51. Here, at a current point in time, the contamination rate of the lower-surface outer region of the substrate W is higher than the contamination rate of the lower-surface brush 51. Therefore, the contaminants that have adhered to the lower-surface region of the substrate W are virtually transferred to the lower-surface brush 51. Thus, the contamination rate of the lower-surface outer region of the substrate W decreases.

Further, in the operation of cleaning the lower-surface outer region of the substrate W, even in a case in which the contamination rate of the lower-surface brush 51 increases, the contamination rate of the lower-surface brush 51 is decreased by the subsequent operation of cleaning the lower-surface brush 51. Therefore, it is possible to make the contamination rate of the lower-surface outer region of the substrate W and the contamination rate of the lower-surface brush 51 be 0% by repeating the operation of cleaning the lower-surface outer region of the substrate W and the operation of cleaning the lower-surface brush 51. Further, because the operation of cleaning the lower-surface outer region of the substrate W and the operation of cleaning the lower-surface brush 51 are repeated during a period in which the upper surface of the substrate W is cleaned, the throughput is not reduced.

Figure 21:
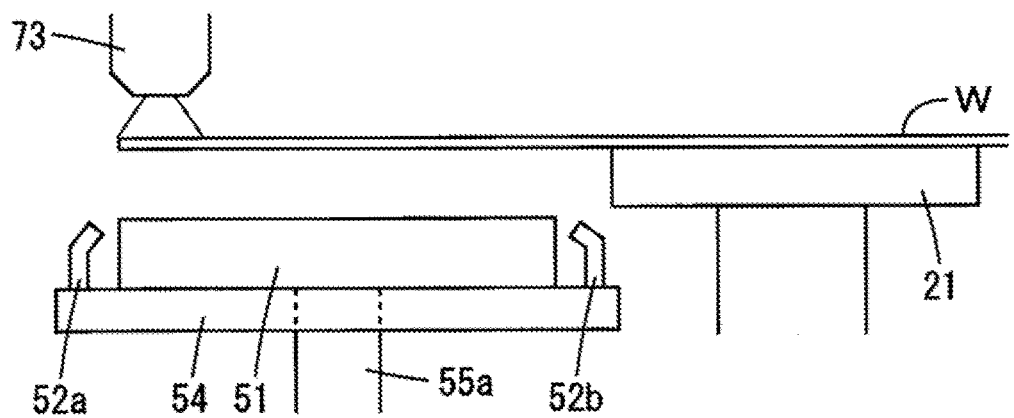
FIG. 21 is a schematic diagram for explaining the schematic operation of the substrate cleaning device in FIG. 12.

Finally, as shown in FIG. 21, the spray nozzle 73 is arrives at a position above the outer periphery of the substrate W. When injection of the fluid mixture from the spray nozzle 73 to the substrate W is stopped, cleaning of the upper surface of the substrate W ends. Further, when the rotation of the lower-surface brush 51 is stopped, and the lower-surface brush 51 is moved to the waiting position, the cleaning of the lower-surface outer region of the substrate W and the cleaning of the lower-surface brush 51 end.

While the cleaning liquid used to clean the lower-surface brush 51 is pure water in the present embodiment, the embodiment is not limited to this. The cleaning liquid used to clean the lower-surface brush 51 may be warm water, functional water, thin alkaline water or a chemical liquid. In a case in which the cleaning liquid is a chemical liquid, the type of a chemical liquid may be suitably changed in accordance with the type of contaminants to be removed.

While the liquid nozzles 52a, 52b stop discharging the cleaning liquid when the lower-surface brush 51 is in the processing position, the embodiment is not limited to this. The liquid nozzles 52a, 52b may also discharge the cleaning liquid when the lower-surface brush 51 is in the processing position, that is, while the lower-surface outer region of the substrate W is being cleaned. Further, the liquid nozzles 52a, 52b may discharge the cleaning liquid even during a period in which the lower-surface brush 51 is lifted and lowered between the waiting position and the processing position.

(4) Substrate Cleaning Process

Figure 22:
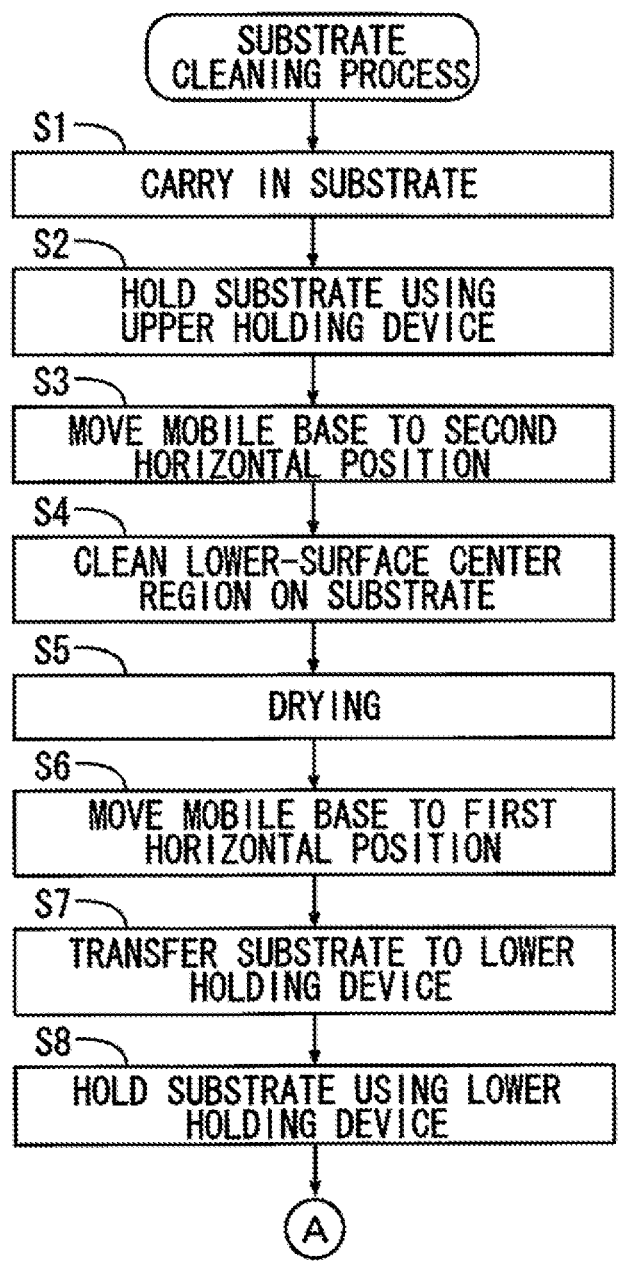
FIG. 22 is a flowchart showing a substrate cleaning process executed by a control device of FIG. 3.
Figure 23:
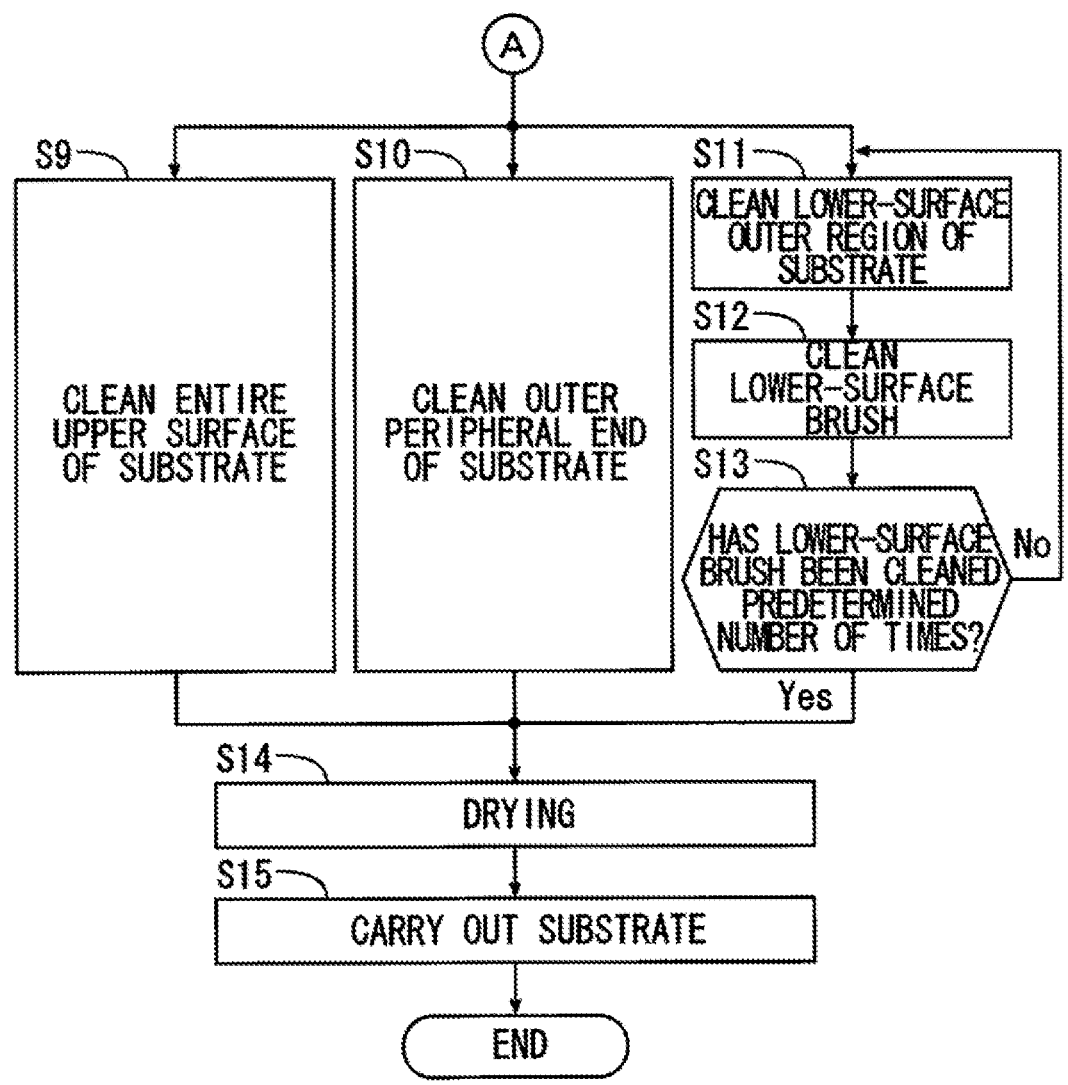
FIG. 23 is a flowchart showing a substrate cleaning process executed by the control device of FIG. 3.

FIGS. 22 and 23 are flowcharts showing a substrate cleaning process executed by the control device 9 of FIG. 3. The substrate cleaning process of FIGS. 22 and 23 are executed by execution of a substrate cleaning program stored in the storage device by the CPU of the control device 9 on the RAM. The substrate cleaning process will be described with reference to the flowcharts of FIGS. 22 and 23, the control device 9 of FIG. 3 and the substrate cleaning device 1 of FIGS. 4 to 21.

Figure 5:
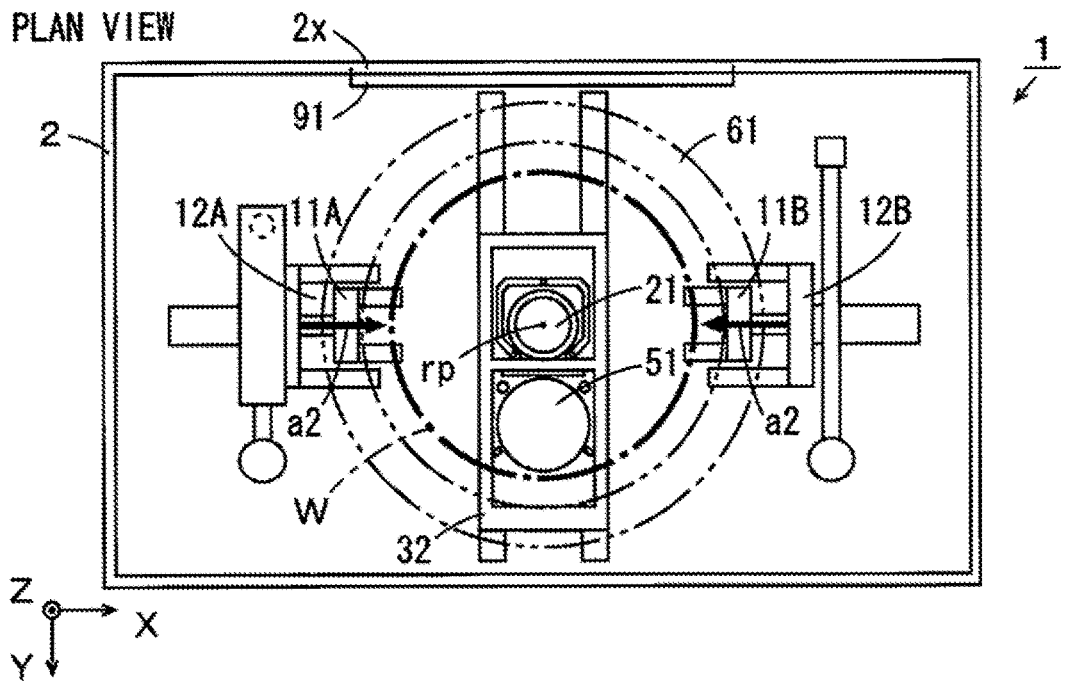
FIG. 5 is a schematic diagram for explaining the schematic operation of the substrate cleaning device of FIG. 1.
Figure 5:
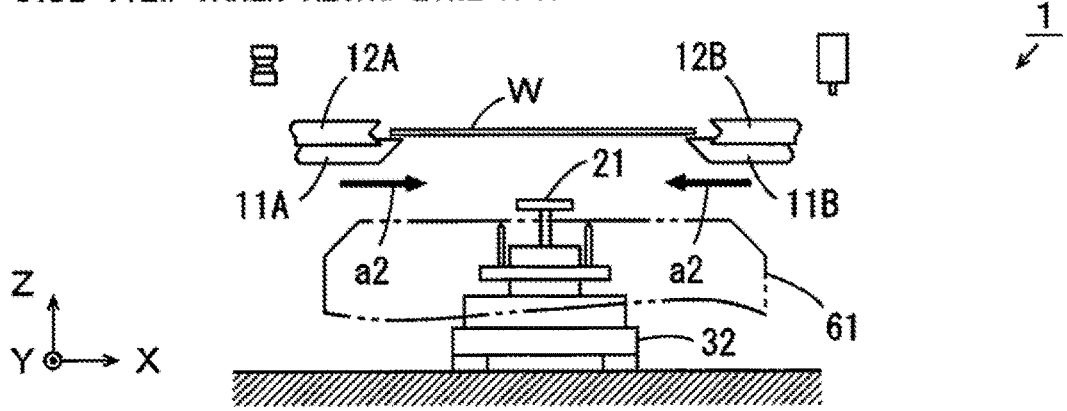
Figure 5:
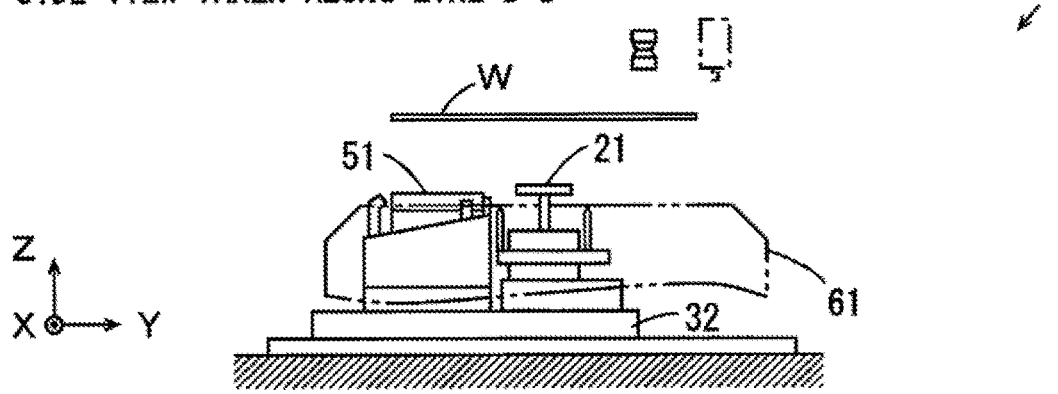

First, the carry-in carry-out controller 9I controls the shutter driver 92, thereby carrying a substrate W into the unit casing 2 (FIGS. 4 and 5, and the step S1). Next, the chuck controller 9A controls the lower chuck drivers 13A, 13B and the upper chuck drivers 14A, 14B, thereby holding the substrate W using the upper holding devices 10A, 10B (FIGS. 5 and 6, and the step S2).

Subsequently, the base controller 9C controls the base driver 33, thereby moving the mobile base 32 from the first horizontal position to the second horizontal position (FIG. 6 and the step S3). Thereafter, the lower-surface cleaning controller 9E controls the lower-surface brush rotation driver 55a, the lower-surface brush lifting-lowering driver 55b, the lower-surface brush movement driver 55c, the lower-surface cleaning liquid supplier 56 and the injection gas supplier 58, thereby cleaning the lower-surface center region of the substrate W (FIG. 7 and the step S4).

Next, the lower-surface cleaning controller 9E controls the injection gas supplier 58, thereby drying the substrate W (FIG. 8 and the step S5). Further, the base controller 9C controls the base driver 33, thereby moving the mobile base 32 from the second horizontal position to the first horizontal position (FIG. 8 and the step S6). In the present example, the steps S5 and S6 are performed substantially at the same time. Thus, the lower-surface center region of the substrate W is sequentially dried.

Subsequently, the chuck controller 9A controls the lower chuck drivers 13A, 13B and the upper chuck drivers 14A, 14B, and the receiving-transferring controller 9D controls the pin lifting-lowering driver 43, whereby the substrate W is received from the upper holding devices 10A, 10B and transferred to the lower holding device 20 (FIGS. 8 to 11, and the step S7). In this state, the suction controller 9B controls the suction holding driver 22 such that the lower-surface center region of the substrate W is sucked. Thus, the substrate W is held by the lower holding device 20 (FIG. 11 and the step S8).

Thereafter, the step S9, the step S10 and the steps S11 to S13 are performed in parallel. When the steps S9 to S13 are performed, the suction controller 9B controls the suction holding driver 22, thereby rotating the substrate W about the axial center of the rotation shaft of the suction holding driver 22. Further, the cup controller 9F controls the cup driver 62, thereby lifting the cup 61 from the lower cup position to the upper cup position.

In the step S9, the upper-surface cleaning controller 9G controls the upper-surface cleaning driver 74 and the upper-surface cleaning fluid supplier 75, thereby cleaning the entire upper surface of the substrate W (FIG. 21, FIGS. 16 to 21 and the step S9). In the step S10, the bevel cleaning controller 9H controls the bevel brush driver 84, thereby cleaning the outer peripheral end of the substrate W (FIG. 12 and the step S10).

In the step S11, the lower-surface cleaning controller 9E controls the lower-surface brush rotation driver 55a, the lower-surface brush lifting-lowering driver 55b, the lower-surface cleaning liquid supplier 56 and the injection gas supplier 58, thereby cleaning the lower-surface outer region of the substrate W (FIG. 12, FIG. 17 and the step S11). In a case in which the lower-surface brush 51 is not relatively large, the lower-surface cleaning controller 9E may further control the lower-surface brush movement driver 55c to move the lower-surface brush 51 in the Y direction together with the mobile base 32 such that the lower-surface outer region of the substrate W is cleaned.

Next, in the step S12, the lower-surface cleaning controller 9E controls the lower-surface brush rotation driver 55a, the lower-surface brush lifting-lowering driver 55b, the brush cleaning liquid supplier 57 and the injection gas supplier 58, thereby cleaning the lower-surface brush 51 (FIG. 18 and the step S12). Next, in the step S13, the lower-surface cleaning controller 9E determines whether the lower-surface brush 51 has been cleaned a predetermined number of times (step S13).

The number of times the lower-surface brush 51 is to be cleaned is set in advance. While the number of times the lower-surface brush 51 is to be cleaned may be any number, the number is preferably equal to or larger than 2. Further, the number of times the lower-surface brush 51 is to be cleaned preferably the number of times the lower-surface brush 51 can be cleaned within a period during which the step S9 is performed.

In a case in which the lower-surface brush 51 has not been cleaned the predetermined number of times, the lower-surface cleaning controller 9E returns to the step S11. In this case, in the step S11, the lower-surface outer region of the substrate W is cleaned again (FIG. 19). Further, in the step S12, the lower-surface brush 51 is cleaned again (FIG. 20). The steps S11 to S13 are repeated until the lower-surface brush 51 is cleaned the predetermined number of times. Thus, the contamination rate of the lower-surface outer region of the substrate W and the contamination rate of the lower-surface brush 51 can both be 0%.

Figure 13:
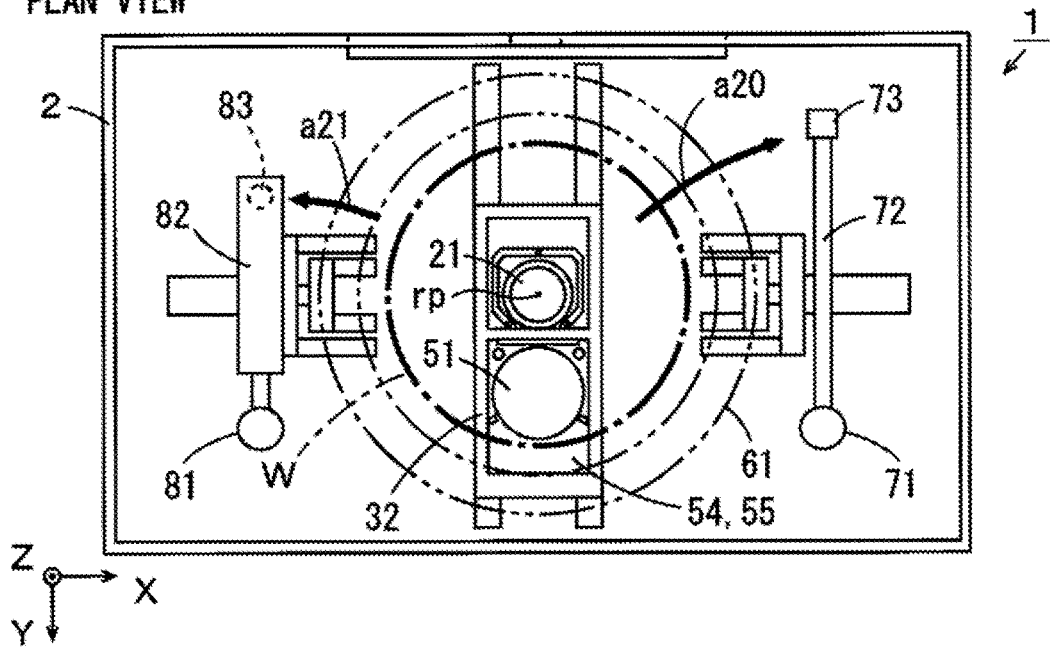
FIG. 13 is a schematic diagram for explaining the schematic operation of the substrate cleaning device of FIG. 1.
Figure 13:
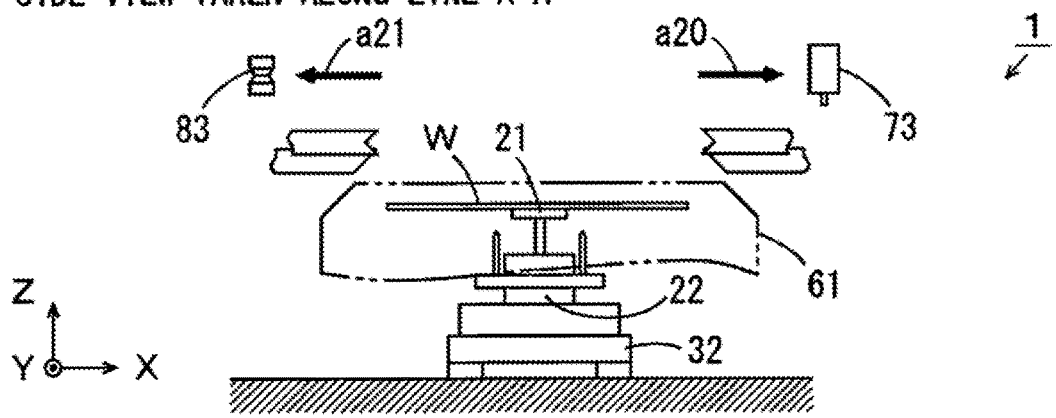
Figure 13:
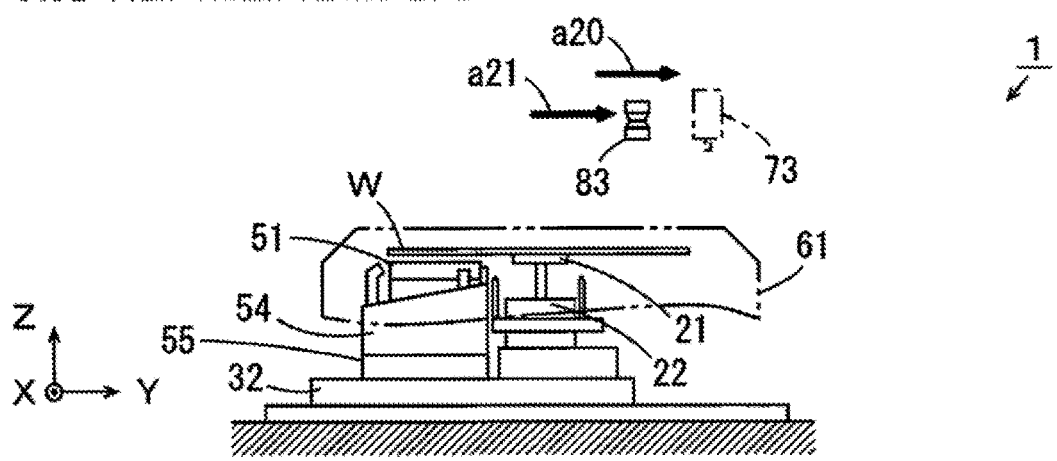

In a case in which the lower-surface brush 51 is cleaned the predetermined number of times, and the steps S9 to S13 are completed, the suction controller 9B controls the suction holding driver 22 to rotate the suction holder 21 at high speed, thereby drying the entire substrate W (FIG. 13 and the step S14). After the drying is completed, the upper holding devices 10A, 10B, the cup 61 and the like are returned to their initial states (FIG. 14). Finally, the carry-in carry-out controller 9I controls the shutter driver 92, thereby carrying out the substrate W from the unit casing 2 (FIG. 15 and the step S15) and ending the substrate cleaning process.

(5) Effects

In the substrate cleaning device 1 according to the present embodiment, because the waiting position of the lower-surface brush 51 overlaps with the substrate W held by the lower holding device 20 in the up-and-down direction, the footprint hardly increases even in a case in which the lower-surface brush 51 is relatively large. Therefore, it is possible to clean the lower surface of the substrate W in a short period of time by using the relatively large lower-surface brush 51.

Further, because the lower surface of the substrate W and the lower-surface brush 51 are cleaned in a period during which the upper surface of the substrate W is cleaned by the upper-surface cleaning device 70, the throughput does not change even in a case in which the step of cleaning the lower-surface brush 51 is provided. Thus, it is possible to maintain cleanliness of the lower-surface brush 51 without a reduction in throughput.

Further, the lower-surface brush 51 is repeatedly lifted and lowered by the lower-surface brush lifting-lowering driver 55b between the processing position and the waiting position such that the lower surface of the substrate W and the lower-surface brush 51 are cleaned multiple times. With this configuration, the lower-surface brush 51 can be cleaned in a short period of time as compared to a case in which the cleaning surface of the lower-surface brush 51 is in contact with the lower surface of the substrate W for a long period of time. Further, because it is not necessary to have the cleaning surface of the lower-surface brush 51 be in contact with the lower surface of the substrate W for a long period of time, wear of the lower-surface brush 51 can be minimized.

When the lower-surface brush 51 is cleaned, the liquid nozzle 52a discharges the cleaning liquid to the center portion of the lower-surface brush 51, and the liquid nozzle 52b discharges the cleaning liquid to the end portion of the lower-surface brush 51. With this construction, even in a case in which the lower-surface brush 51 is relatively large, the entire lower-surface brush 51 can be easily cleaned.

[2] Second Embodiment (1) Configuration of Substrate Cleaning Device

Figure 24:
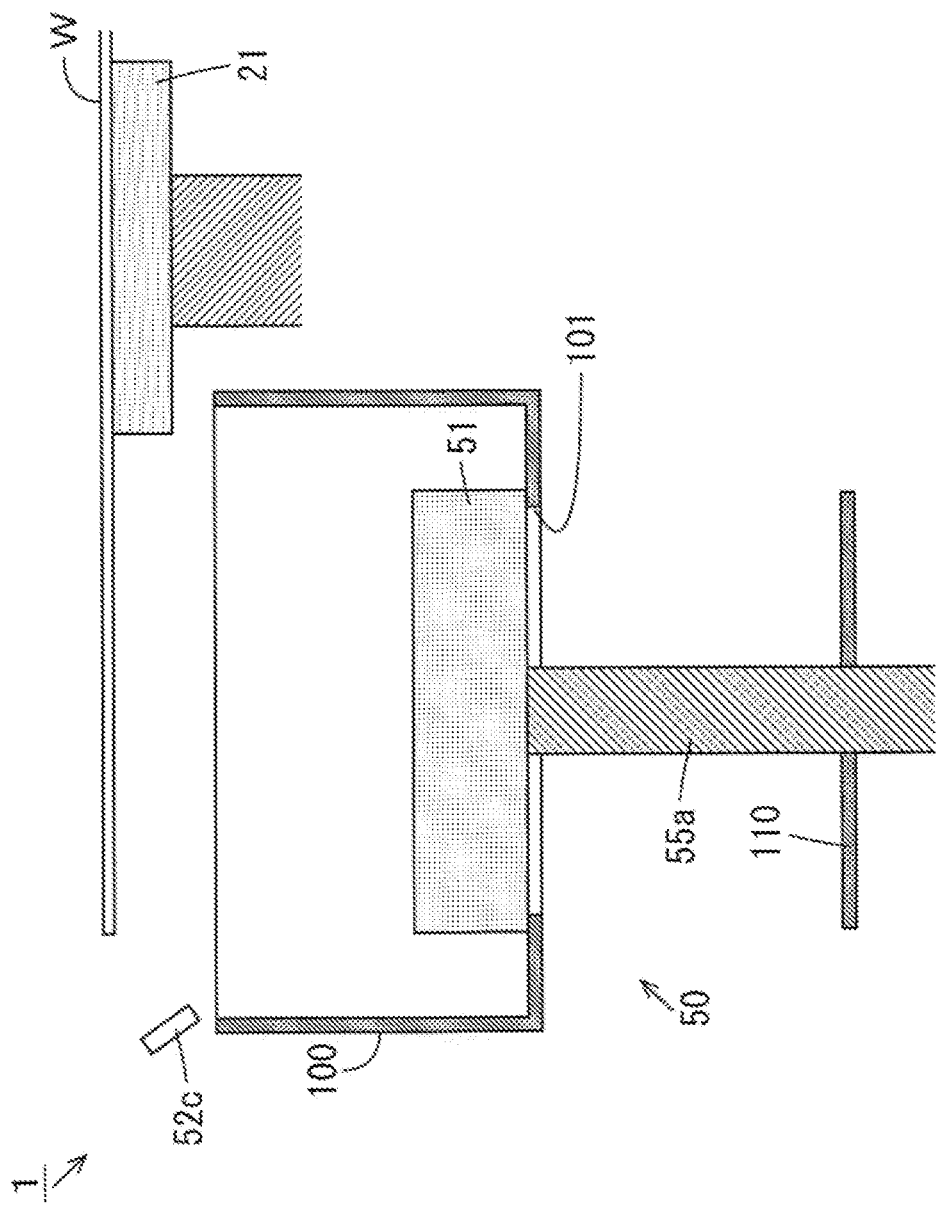
FIG. 24 is an enlarged cross sectional view showing the configuration of a portion in the vicinity of a lower-surface brush of a substrate cleaning device according to a second embodiment.

Differences of a substrate cleaning device 1 according to a second embodiment from the substrate cleaning device 1 according to the first embodiment will be described. FIG. 24 is an enlarged cross sectional view showing the configuration of a portion in the vicinity of a lower-surface brush 51 of the substrate cleaning device 1 according to the second embodiment. As shown in FIG. 24, the substrate cleaning device 1 according to the present embodiment further includes a cleaning tank 100 arranged at a waiting position. The cleaning tank 100 has a cup shape and stores a cleaning liquid. Further, the cleaning tank 100 contains a lower-surface brush 51 located at the waiting position.

A lower-surface cleaning device 50 does not include a lifting-lowering supporter 54, and a lower-surface brush 51 is attached to the upper end of a rotation shaft of a lower-surface brush rotation driver 55a. Further, the lower-surface cleaning device 50 includes a liquid nozzle 52c instead of the liquid nozzles 52a, 52b of FIG. 16. The liquid nozzle 52c is supported by a support member (not shown) and connected to the brush cleaning liquid supplier 57 of FIG. 3. The brush cleaning liquid supplier 57 supplies a cleaning liquid to the liquid nozzle 52c. The liquid nozzle 52c discharges the cleaning liquid supplied by the brush cleaning liquid supplier 57 into the cleaning tank 100.

Further, in the present embodiment, the liquid nozzle 52 and the gas injector 53 of FIG. 12 are supported by a support member (not shown). The operations of the liquid nozzle 52 and the gas injector 53 in the present embodiment are respectively similar to those of the liquid nozzle 52 and the gas injector 53 in the first embodiment.

Below the lower-surface brush 51, a flat plate-shaped closing portion 110 is attached to the rotation shaft of the lower-surface brush rotation driver 55a. Further, an opening 101 through which the rotating shaft of the lower-surface brush rotation driver 55a is inserted is formed in the bottom surface of the cleaning tank 100. The cleaning liquid stored in the cleaning tank 100 is gradually discharged from the opening 101. The area of the opening 101 is smaller than the area of the bottom portion of the lower-surface brush 51 and smaller than the area of the closing portion 110.

When the lower-surface brush 51 is lowered to the waiting position, the bottom portion of the lower-surface brush 51 comes into contact with the upper portion of the bottom surface of the cleaning tank 100 so as to overlap with the opening 101 while the closing portion 110 is spaced apart from the bottom portion of the cleaning tank 100. Thus, the opening 101 is closed. When the lower-surface brush 51 is lifted to the processing position, the closing portion 110 comes into contact with the lower portion of the bottom surface of the cleaning tank 100 so as to overlap with the opening 101 while the lower-surface brush 51 is spaced apart from the bottom portion of the cleaning tank 100. Thus, the opening 101 is closed.

The flow rate of the cleaning liquid discharged from the opening 101 when the opening 101 is closed is smaller than the flow rate of the cleaning liquid discharged from the opening 101 when the opening 101 is not closed. That is, the opening 101 does not have to be completely closed. Therefore, in a case in which the lower-surface brush 51 is in the waiting position, the bottom portion of the lower-surface brush 51 does not have to be firmly in contact with the upper portion of the bottom surface of the cleaning tank 100. Further, in a case in which the lower-surface brush 51 is at the processing position, the closing portion 110 does not have to be firmly in contact with the lower portion of the bottom surface of the cleaning tank 100.

(2) Operation of Substrate Cleaning Device

FIGS. 25 to 29 are schematic diagrams for explaining the operation of cleaning the lower-surface brush 51 of FIG. 24. The substrate cleaning device 1 according to the present embodiment basically operates in a similar manner to the substrate cleaning device 1 according to the first embodiment shown in FIGS. 4 to 15. Therefore, although an operation of the substrate cleaning device 1 other than the operation of cleaning the lower-surface brush 51 in FIG. 12 is not described in FIGS. 25 to 29, the upper surface of a substrate W is also cleaned in parallel.

Figure 25:
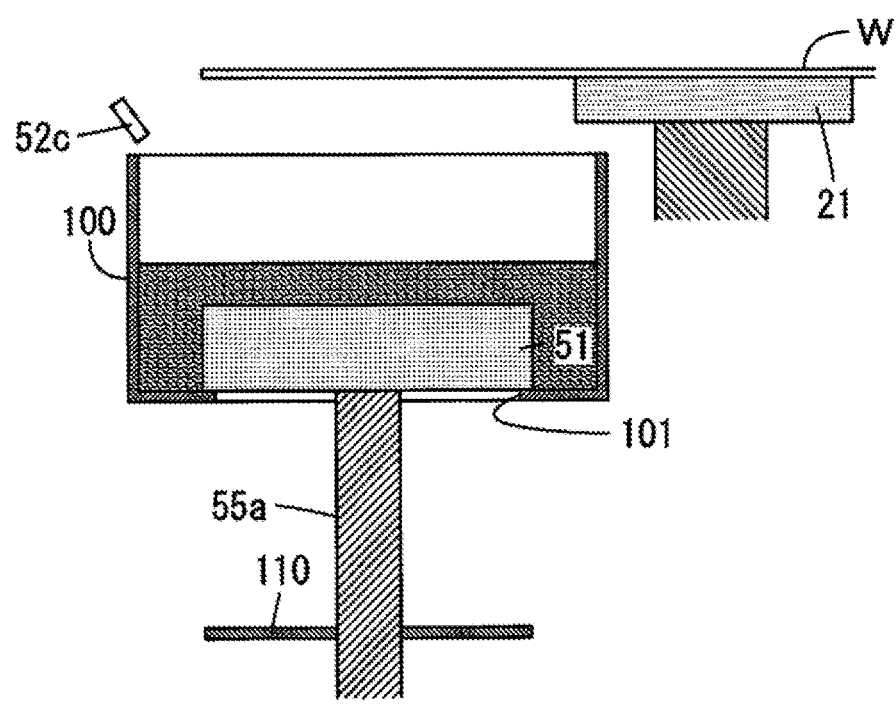
FIG. 25 is a schematic diagram for explaining an operation of cleaning the lower-surface brush of FIG. 24.

As shown in FIG. 25, before the lower-surface outer region of the substrate W is cleaned, the lower-surface brush 51 is contained in the cleaning tank 100 at the waiting position. At this time, part of the cleaning liquid used in the previous step of cleaning the lower-surface brush 51 may remain in the cleaning tank 100. In this case, the cleaning liquid stored in the cleaning tank 100 is gradually discharged from the opening 101.

Figure 26:
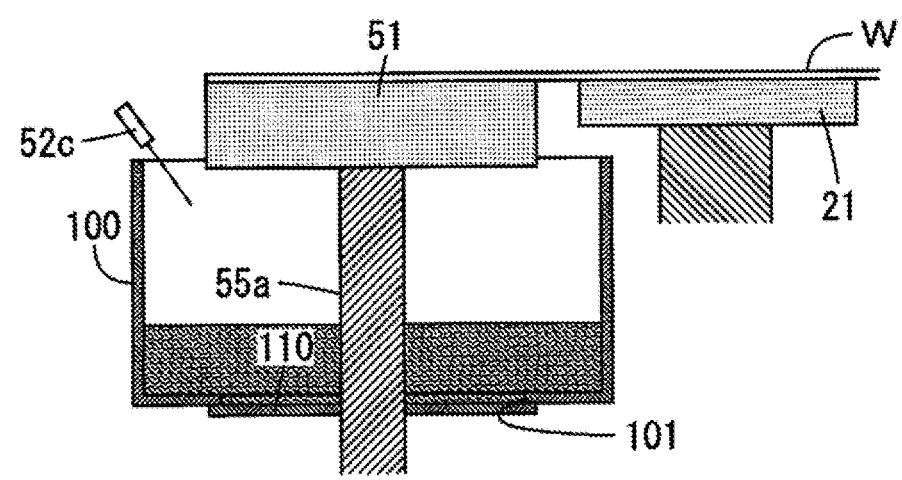
FIG. 26 is a schematic diagram for explaining the operation of cleaning the lower-surface brush of FIG. 24.

Next, as shown in FIG. 26, the lower-surface brush 51 is lifted from the waiting position to the processing position above the waiting position such that the cleaning surface of the lower-surface brush 51 comes into contact with the lower-surface outer region of the substrate W. Further, the cleaning liquid is discharged from the liquid nozzle 52c into the cleaning tank 100. In this case, because the opening 101 is closed by the closing portion 110, an amount of the cleaning liquid supplied into the cleaning tank 100 per unit time is larger than an amount of the cleaning liquid discharged from the cleaning tank 100.

Figure 27:
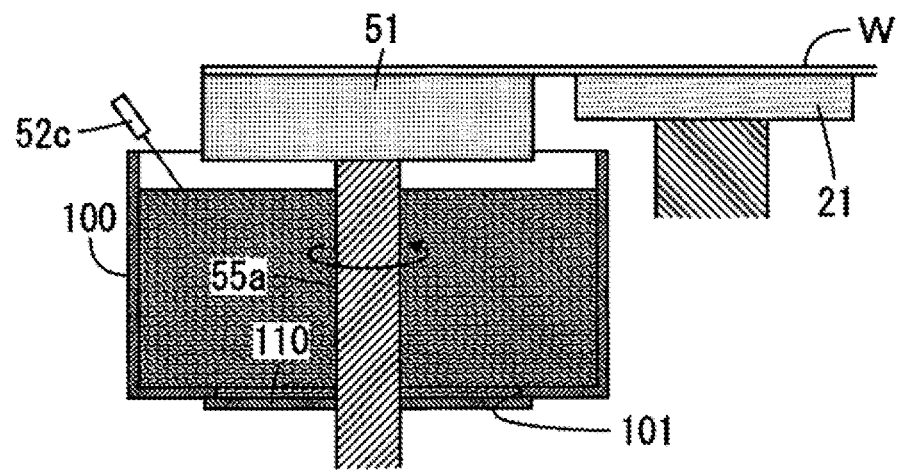
FIG. 27 is a schematic diagram for explaining the operation of cleaning the lower-surface brush of FIG. 24.

Subsequently, as shown in FIG. 27, the lower-surface brush 51 is rotated by the lower-surface brush rotation driver 55a. At this time, the cleaning liquid is discharged from the liquid nozzle 52 of FIG. 12 to the lower surface of the substrate W, and gas is injected toward the lower surface of the substrate W from the gas injector 53 of FIG. 12. Thus, the lower-surface outer region of the substrate W is cleaned. Further, during a period in which the lower-surface outer region of the substrate W is cleaned, the opening 101 is closed by the closing portion 110 while the liquid nozzle 52c continues to discharge the cleaning liquid. Therefore, the liquid level of the cleaning liquid in the cleaning tank 100 rises.

Figure 28:
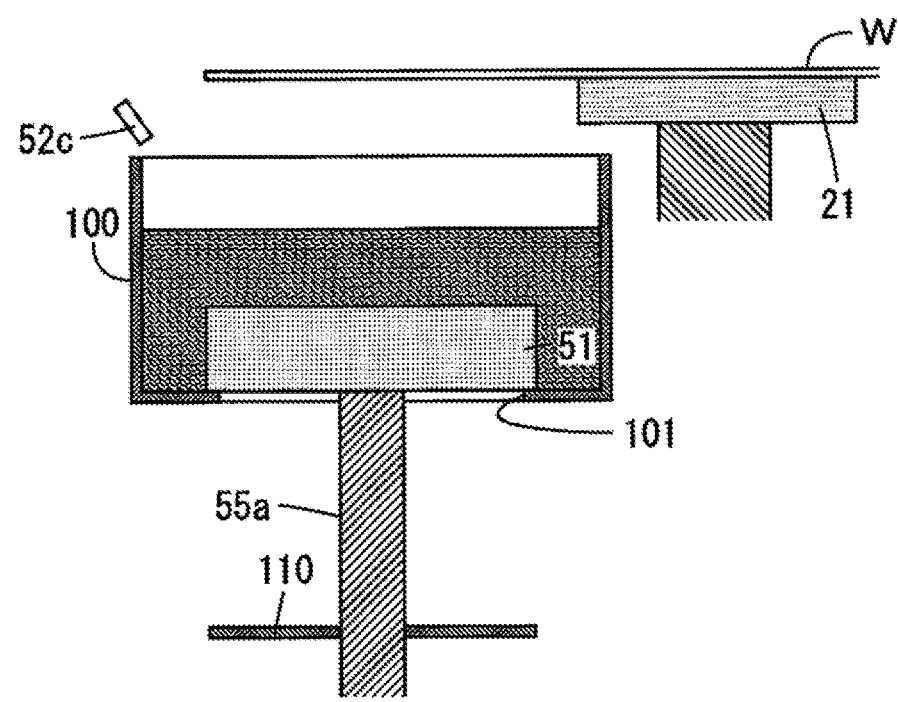
FIG. 28 is a schematic diagram for explaining the operation of cleaning the lower-surface brush of FIG. 24.

After the lower-surface outer region of the substrate W is cleaned, rotation of the lower-surface brush 51 and discharging of the cleaning liquid from the liquid nozzle 52c are stopped as shown in FIG. 28. Further, the lower-surface brush 51 is lowered from the processing position to the waiting position below the processing position such that the cleaning surface of the lower-surface brush 51 is spaced apart from the lower-surface outer region of the substrate W. In this case, although the cleaning liquid is gradually discharged from the opening 101, because the opening 101 is closed by the lower-surface brush 51, a sufficient amount of the cleaning liquid remains in the cleaning tank 100. Therefore, the lower-surface brush 51 is immersed in the cleaning liquid stored in the cleaning tank 100.

Figure 29:
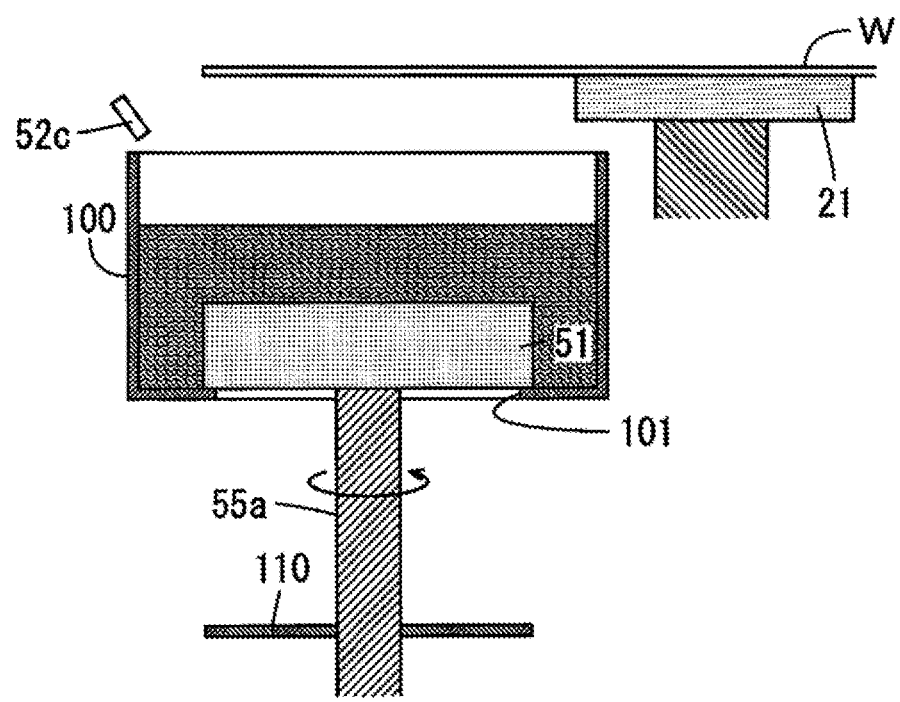
FIG. 29 is a schematic diagram for explaining the operation of cleaning the lower-surface brush of FIG. 24.

Finally, as shown in FIG. 29, the lower-surface brush 51 is rotated by the lower-surface brush rotation driver 55a. In this case, an outward flow of the cleaning liquid is generated in the cleaning tank 100. Thus, contaminants adhering to the lower-surface brush 51 are efficiently removed, and the removed contaminants are discharged from the opening 101 together with the cleaning liquid. As a result, the lower-surface brush 51 is cleaned. Also in the present embodiment, ultrasonic cleaning may be used in combination to clean the lower-surface brush 51.

Further, a small amount of chemical liquid may be added to the cleaning liquid. In this case, because the cleaning liquid to which the chemical liquid is added is stirred in the cleaning tank 100, the lower-surface brush 51 is efficiently cleaned with a small amount of the cleaning liquid. Thus, the consumption of the cleaning liquid can be reduced. In a case in which contaminants are particles such as resist, a chemical solution to be added may be an alkaline aqueous solution. In a case in which contaminants include a metal component, a chemical solution to be added may be an acidic aqueous solution.

While the liquid nozzle 52c stops discharging the cleaning liquid when the lower-surface brush 51 is in the waiting position, the embodiment is not limited to this. The liquid nozzle 52c may discharge the cleaning liquid even when the lower-surface brush 51 is in the waiting position. Further, the liquid nozzle 52c may discharge the cleaning liquid even in a period during which the lower-surface brush 51 is lifted and lowered between the waiting position and the processing position.

In FIG. 26, rotation of the lower-surface brush 51 may be started before the lower-surface brush 51 is moved to the processing position. Similarly, in FIG. 29, rotation of the lower-surface brush 51 may be started before the lower-surface brush 51 is moved to the waiting position. That is, the lower-surface brush 51 may also be rotated while being moved between the waiting position and the processing position. On the other hand, although the lower-surface brush 51 is rotated at the waiting position in the operation of cleaning the lower-surface brush 51 of FIG. 29, in a case in which the lower-surface brush 51 is sufficiently cleaned in the cleaning tank 100, the lower-surface brush 51 does not have to be rotated at the waiting position.

(3) Effects

Also in the substrate cleaning device 1 according to the present embodiment, because the waiting position of the lower-surface brush 51 overlaps with a substrate W held by the lower holding device 20 in the up-and-down direction, the footprint hardly increases even in a case in which the lower-surface brush 51 is relatively large. Therefore, it is possible to clean the lower surface of the substrate W in a short period of time by using the relatively large lower-surface brush 51. Therefore, even in a case in which the step of cleaning the lower-surface brush 51 is provided, the throughput does not change. Thus, it is possible to maintain the cleanliness of the lower-surface brush 51 without a reduction in throughput.

When being cleaned, the lower-surface brush 51 is immersed in the cleaning liquid stored in the cleaning tank 100. With this configuration, even in a case in which the lower-surface brush 51 is relatively large, the entire lower-surface brush 51 can be easily cleaned. Further, because it is not necessary to have the cleaning surface of the lower-surface brush 51 be in contact with the lower surface of the substrate W for a long period of time, wear of the lower-surface brush 51 can be minimized.

(4) Modified Example

Figure 30:
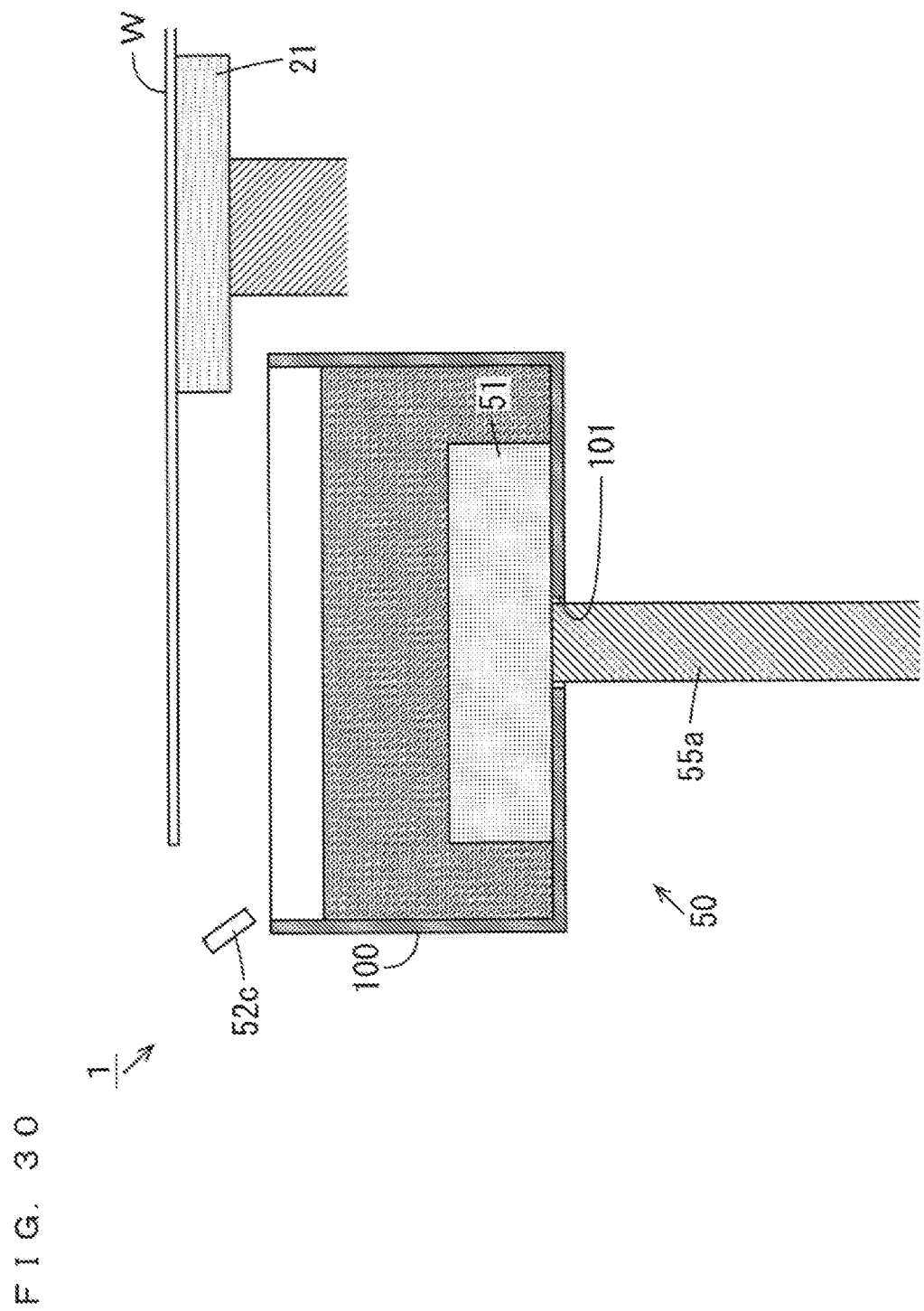
FIG. 30 is an enlarged cross sectional view showing the configuration of a portion in the vicinity of a lower-surface brush of a substrate cleaning device according to a first modified example.

While the substrate cleaning device 1 includes the closing portion 110 in the above-mentioned embodiment, the embodiment is not limited to this. FIG. 30 is an enlarged cross sectional view showing the configuration of a portion in the vicinity of a lower-surface brush 51 of a substrate cleaning device 1 according to a first modified embodiment. As shown in FIG. 30, in the present modified example, the area of an opening 101 of a cleaning tank 100 is relatively small and slightly larger than the cross-sectional area of a rotation shaft of a lower-surface brush rotation driver 55a. In this case, because an amount of the cleaning liquid discharged from a cleaning tank 100 per unit time is relatively small, the substrate cleaning device 1 does not include a closing portion 110.

Figure 31:
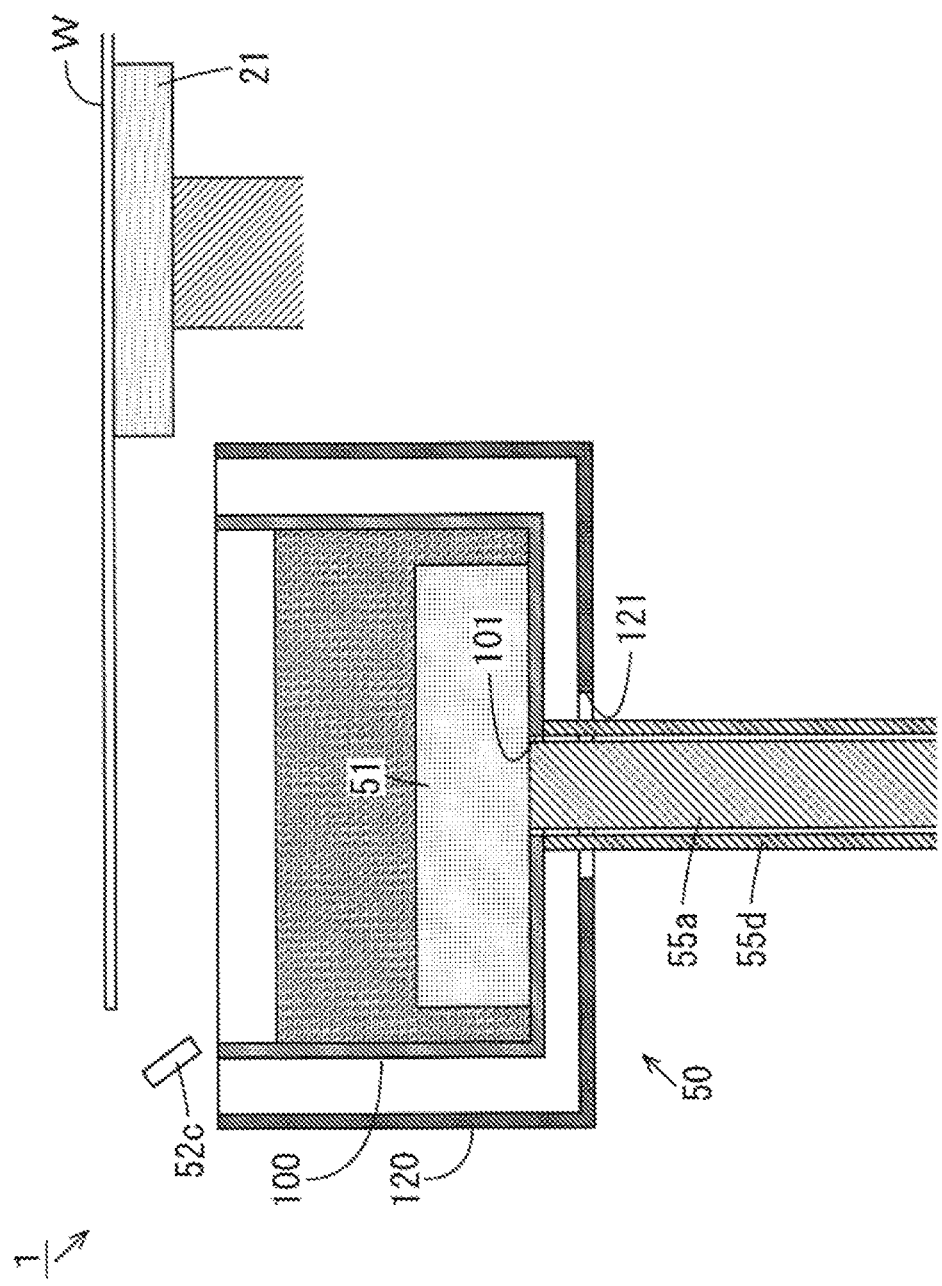
FIG. 31 is an enlarged cross sectional view showing the configuration of a portion in the vicinity of a lower-surface brush of a substrate cleaning device according to a second modified example.
Figure 32:
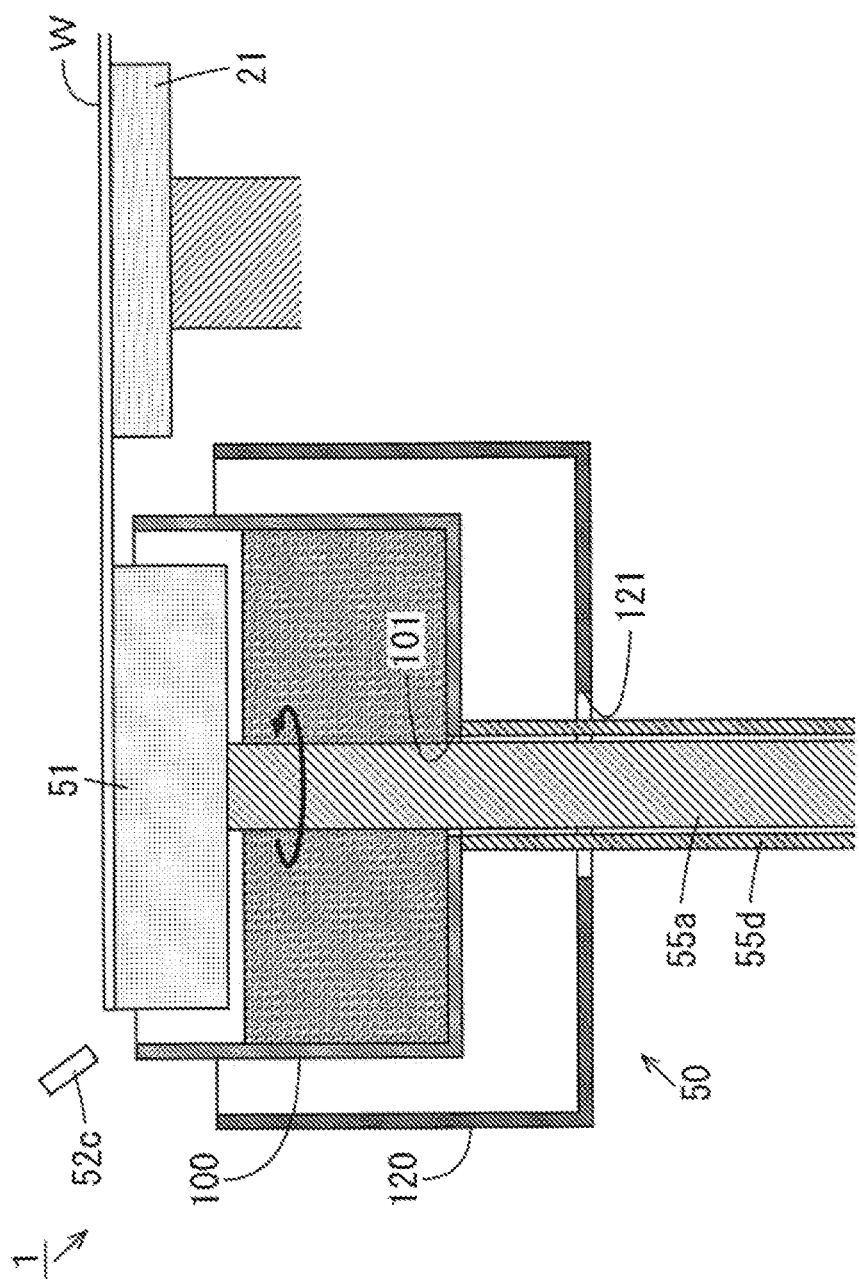
FIG. 32 is an enlarged cross sectional view showing the configuration of the portion in the vicinity of the lower-surface brush of the substrate cleaning device according to the second modified example.
Figure 33:
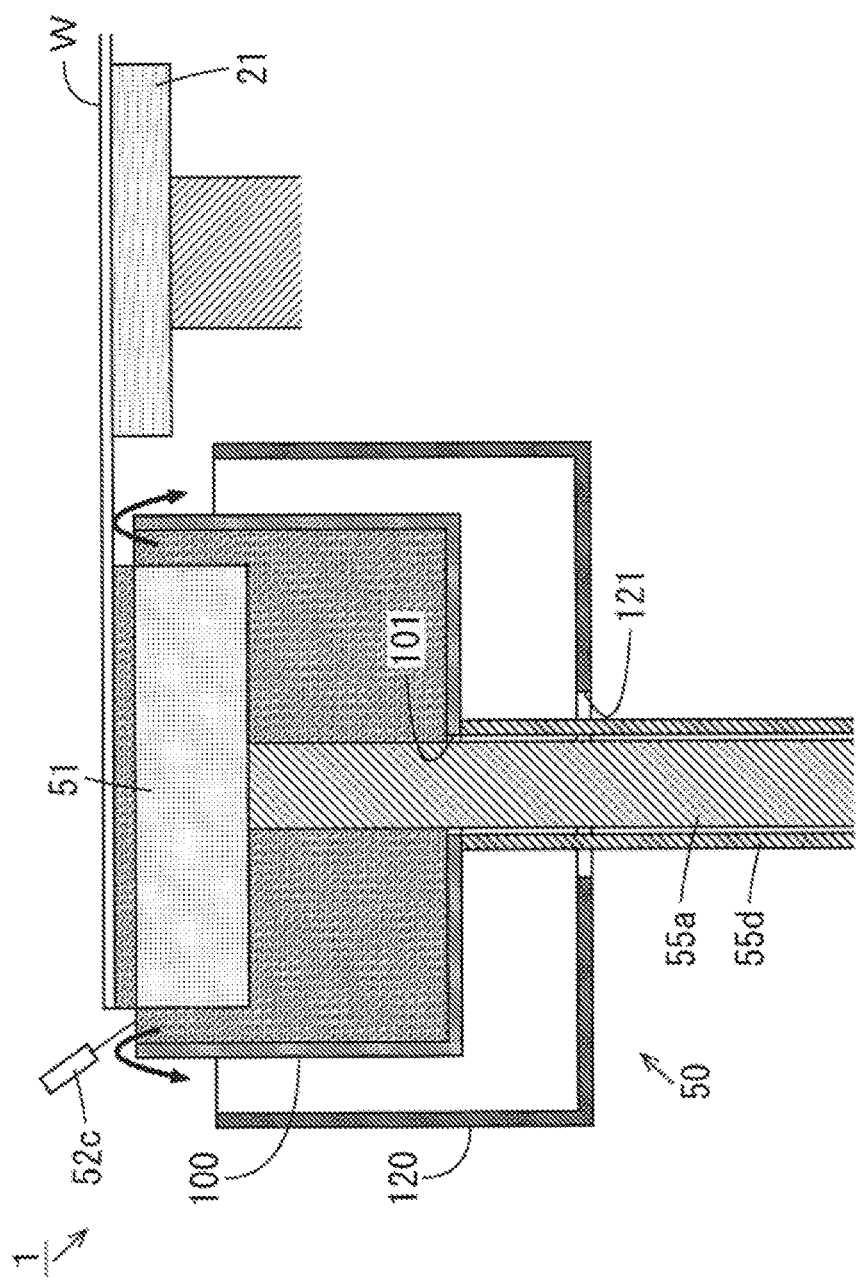
FIG. 33 is an enlarged cross sectional view showing the configuration of the portion in the vicinity of the lower-surface brush of the substrate cleaning device according to the second modified example.

FIGS. 31 to 33 are enlarged cross-sectional views showing the configuration of a portion in the vicinity of a lower-surface brush 51 of a substrate cleaning device 1 according to a second modified example. As shown in FIG. 31, the substrate cleaning device 1 according to the present modified example further includes a cleaning tank lifting-lowering driver 55d and an external tank 120. The cleaning tank lifting-lowering driver 55d includes a stepping motor or an air cylinder, and lifts and lowers a cleaning tank 100 with respect to the movement supporter 55 of FIG. 1 based on the control of the lower-surface cleaning controller 9E of FIG. 3.

The cleaning tank lifting-lowering driver 55d has a hollow drive shaft. The drive shaft of the cleaning tank lifting-lowering driver 55d is attached to a lower portion of the bottom surface of the cleaning tank 100 so as to surround an opening 101 and the rotation shaft of a lower-surface brush rotation driver 55a. The external tank 120 has a cup shape and is arranged so as to surround the cleaning tank 100 at a waiting position. In the bottom surface of the external tank 120, an opening 121 through which the rotation shaft of the lower-surface brush rotation driver 55a and the drive shaft of the cleaning tank lifting-lowering driver 55d are inserted is formed.

When the lower-surface outer region of a substrate W is cleaned, a lower-surface brush 51 is lifted from the waiting position to a processing position by the lower-surface brush lifting-lowering driver 55b of FIG. 3 as shown in FIG. 32. Further, the cleaning tank 100 is lifted from the waiting position by the cleaning tank lifting-lowering driver 55d to be brought closer to the substrate W. In this state, the lower-surface brush 51 is rotated such that the lower-surface outer region of the substrate W is cleaned. Further, the cleaning liquid splashed from the lower-surface brush 51 is received by the external tank 120. Thus, the area around the cleaning tank 100 is prevented from being contaminated.

Further, after the lower-surface outer region of the substrate W is cleaned, the lower-surface brush 51 may be lowered from the processing position by the lower-surface brush lifting-lowering driver 55b until the cleaning surface of the lower-surface brush 51 becomes equal to or lower than the height of the upper end of the cleaning tank 100 as shown in FIG. 33. In this state, a liquid nozzle 52c may discharge a cleaning liquid an amount of which larger than an amount of a cleaning liquid discharged from the cleaning tank 100 per unit time into the cleaning tank 100. In this case, the cleaning liquid overflows from the cleaning tank 100, and a liquid column made of the cleaning liquid is formed between the substrate W and the cleaning surface of the lower-surface brush 51. The lower-surface brush 51 is cleaned by this liquid column made of the cleaning liquid. As a result, an amount of the cleaning liquid used for cleaning the lower-surface brush 51 can be reduced.

Figure 34:
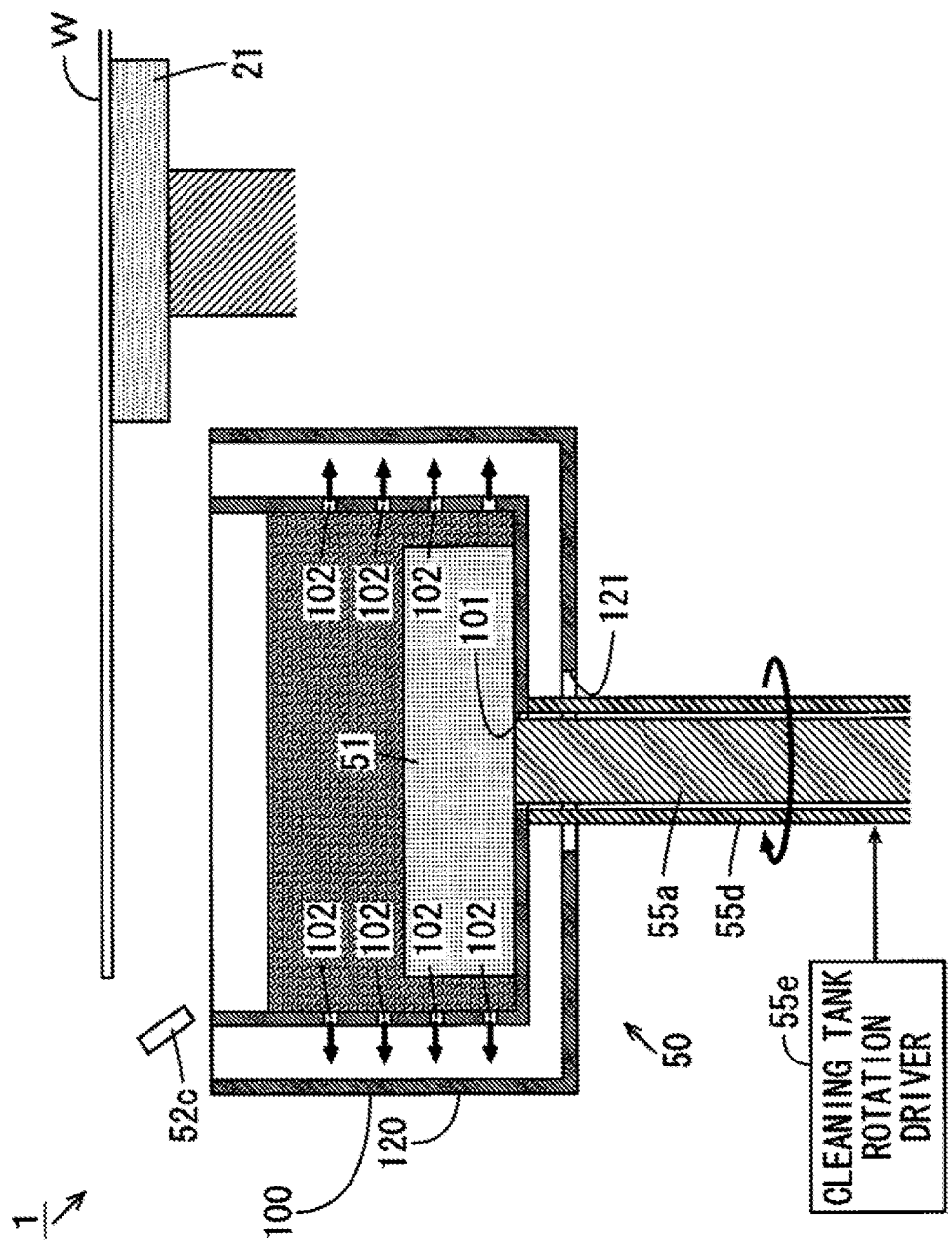
FIG. 34 is an enlarged cross sectional view showing the configuration of a portion in the vicinity of a lower-surface brush of a substrate cleaning device according to a third modified example.

FIG. 34 is an enlarged cross-sectional view showing the configuration of a portion in the vicinity of a lower-surface brush 51 of a substrate cleaning device 1 according to a third modified example. As shown in FIG. 34, the substrate cleaning device 1 according to the present modified example further includes a cleaning tank rotation driver 55e. The cleaning tank rotation driver 55e includes a motor, for example, and rotates a cleaning tank lifting-lowering driver 55d via a power transmission member such as a belt and a pulley based on the control of the lower-surface cleaning controller 9E of FIG. 9. Thus, a cleaning tank 100 can be rotated.

Further, a plurality of liquid drain holes 102 are formed in the sidewall of the cleaning tank 100. When a lower-surface brush 51 is cleaned, the cleaning tank 100 is rotated by the cleaning tank rotation driver 55e. In this case, the cleaning liquid in the cleaning tank 100 is discharged from the plurality of liquid drain holes 102, so that an outward flow of the cleaning liquid is generated in the cleaning tank 100. Thus, contaminants adhering to the lower-surface brush 51 are efficiently removed, and the removed contaminants are discharged from the liquid drain holes 102 together with the cleaning liquid. As a result, the lower-surface brush 51 is cleaned.

In the present modified example, when the lower-surface brush 51 is cleaned, the lower-surface brush 51 may be rotated in a direction opposite to the rotation direction of the cleaning tank 100. In this case, an outward flow of the cleaning liquid can be more easily generated in the cleaning tank 100. Thus, contaminants adhering to the lower-surface brush 51 can be removed more efficiently. Further, in the present modified example, in a case in which an outward flow of the cleaning liquid can be easily generated in the cleaning tank 100, the liquid drain holes 102 do not have to be formed in the cleaning tank 100.

[3] Other Embodiments (1) While the lower-surface outer region of a substrate W and the lower-surface brush 51 are cleaned in the lower holding device 20 after the lower-surface center region of the substrate W is cleaned in the upper holding devices 10A, 10B in the above-mentioned embodiment, the embodiment is not limited to this. The lower-surface center region of the substrate W may be cleaned in the upper holding devices 10A, 10B after cleaning of the lower-surface outer region of the substrate W in the lower holding device 20 and cleaning of the lower-surface brush 51 are performed. Further, the lower-surface center region of the substrate W does not have to be cleaned. In this case, the substrate cleaning device 1 does not include the upper holding devices 10A, 10B or the receiving-transferring device 40.

(2) While the upper surface of a substrate W is cleaned with use of the spray nozzle 73 in the above-mentioned embodiment, the embodiment is not limited to this. The upper surface of a substrate W may be cleaned with use of a brush or a rinse nozzle for discharging a rinse liquid. Further, the upper surface of a substrate W does not have to be cleaned. In this case, the substrate cleaning device 1 does not include the upper-surface cleaning device 70. Similarly, the outer peripheral end of a substrate W does not have to be cleaned. In this case, the substrate cleaning device 1 does not include the end-portion cleaning device 80.

(3) While the substrate cleaning device 1 includes the control device 9 in the above-mentioned embodiment, the embodiment is not limited to this. In a case in which being configured to be controllable by an external information processing apparatus, the substrate cleaning device 1 does not have to include the control device 9.

(4) While the lower-surface brush 51 is cleaned by the cleaning liquid discharged from the liquid nozzles 52a, 52b in the first embodiment, the embodiment is not limited to this. Similarly to the second embodiment, the substrate cleaning device 1 may include the liquid nozzle 52c, the cleaning tank 100 and the like instead of the liquid nozzles 52a, 52b. In this case, the lower-surface brush 51 may be cleaned by the cleaning liquid discharged from the liquid nozzle 52c in the cleaning tank 100. Further, the cleaning of the lower-surface outer region of a substrate W at the processing position and the cleaning of the lower-surface brush 51 at the waiting position may be repeated or may be not repeated.

[4] Correspondence Relationship Between Respective Components of Claims and Respective Portions of Embodiments In the following paragraphs, non-limiting examples of correspondences between various elements recited in the claims below and those described above with respect to various preferred embodiments of the present disclosure are explained.

In the above-mentioned embodiment, the substrate W is an example of a substrate, the suction holder 21 is an example of a substrate holder, the lower-surface brush 51 is an example of a lower-surface brush, the liquid nozzles 52a, 52b or the cleaning tank 100 is an example of a brush cleaner, and the lower-surface brush lifting-lowering driver 55b is an example of a lower-surface brush lifting-lowering driver. The substrate cleaning device 1 is an example of a substrate cleaning device, the upper-surface cleaning device 70 is an example of an upper-surface cleaner, the liquid nozzles 52a, 52b are examples of a first liquid nozzle and a second liquid nozzle, respectively, and the cleaning tank 100 is an example of a cleaning tank.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:
1. A substrate cleaning device comprising:
   a substrate holder that holds a substrate in a horizontal attitude;
   a lower-surface brush that cleans a lower surface of the substrate held by the substrate holder at a processing position;
   a brush cleaner that cleans the lower-surface brush at a waiting position that overlaps with the substrate held by the substrate holder in an up-and-down direction and is below the processing position;
   a lifting-lowering supporter to which the lower-surface brush and the brush cleaner are attached; and
   a lower-surface brush lifting-lowering driver that lifts and lowers the lower-surface brush between the processing position and the waiting position by lifting and lowering the lifting-lowering supporter,
wherein the brush cleaner is lifted and lowered together with the lower-surface brush by lifting and lowering of the lifting-lowering supporter, and cleans the lower surface brush by discharging a cleaning liquid to the lower-surface brush in a period during which at least the lower-surface brush is spaced apart from the substrate.

2. The substrate cleaning device according to claim 1, further comprising an upper-surface cleaner that cleans an upper surface of the substrate held by the substrate holder,
wherein the lower-surface brush lifting-lowering driver lifts and lowers the lower-surface brush between the processing position and the waiting position such that a lower surface of the substrate and the lower-surface brush are cleaned in a period during which the upper surface of the substrate is cleaned by the upper-surface cleaner.

3. The substrate cleaning device according to claim 1, wherein
the lower-surface brush lifting-lowering driver lifts and lowers the lower-surface brush repeatedly between the processing position and the waiting position such that a lower surface of the substrate and the lower-surface brush are cleaned multiple times.

4. The substrate cleaning device according to claim 1, wherein
the brush cleaner includes a first liquid nozzle that discharges a cleaning liquid to a center portion of the lower-surface brush and a second liquid nozzle that discharges a cleaning liquid to an end portion of the lower-surface brush.

5. The substrate cleaning device according to claim 1, wherein each of the substrate holder and the lower-surface brush has a circular outer shape, and a diameter of the lower-surface brush is larger than a diameter of the substrate holder.

6. The substrate cleaning device according to claim 1, wherein each of the substrate and the lower-surface brush has a circular outer shape, and a diameter of the lower-surface brush is larger than $1/3$ of a diameter of the substrate.

7. A substrate cleaning device comprising:
a substrate holder that holds a substrate in a horizontal attitude;
a lower-surface brush that cleans a lower surface of the substrate held by the substrate holder at a processing position;
a brush cleaner that cleans the lower-surface brush at a waiting position that overlaps with the substrate held by the substrate holder in an up-and-down direction and is below the processing position; and
a lower-surface brush lifting-lowering driver that lifts and lowers the lower-surface brush between the processing position and the waiting position,
wherein the brush cleaner includes a cleaning tank that stores a cleaning liquid in which the lower-surface brush is immersed.

8. A substrate cleaning method including:
holding a substrate in a horizontal attitude using a substrate holder;
cleaning a lower surface of the substrate held by the substrate holder using a lower-surface brush attached to a lifting-lowering supporter at a processing position;
cleaning the lower-surface brush using a brush cleaner attached to the lifting-lowering supporter at a waiting position that overlaps with the substrate held by the substrate holder in an up-and-down direction and is below the processing position; and
lifting and lowering the lower-surface brush between the processing position and the waiting position by lifting and lowering the lifting-lowering supporter,
wherein the brush cleaner is lifted and lowered together with the lower-surface brush by lifting and lowering of the lifting-lowering supporter, and
the cleaning the lower-surface brush includes discharging a cleaning liquid to the lower-surface brush by the brush cleaner in a period during which at least the lower-surface brush is spaced apart from the substrate.

9. The substrate cleaning method according to claim 8, further including cleaning an upper surface of the substrate held by the substrate holder using an upper-surface cleaner, wherein
a lower surface of the substrate and the lower-surface brush are cleaned in a period during which the upper surface of the substrate is cleaned by the upper-surface cleaner.

10. The substrate cleaning method according to claim 8, wherein
the lifting and lowering the lower-surface brush between the processing position and the waiting position is repeated such that a lower surface of the substrate and the lower-surface brush are cleaned multiple times.

11. The substrate cleaning method according to claim 8, wherein
the cleaning the lower-surface brush using a brush cleaner includes discharging a cleaning liquid to a center portion of the lower-surface brush using a first liquid nozzle and discharging a cleaning liquid to an end portion of the lower-surface brush using a second liquid nozzle.

12. The substrate cleaning method according to claim 8, wherein each of the substrate holder and the lower-surface brush has a circular outer shape, and a diameter of the lower-surface brush is larger than a diameter of the substrate holder.

13. The substrate cleaning method according to claim 8, wherein each of the substrate and the lower-surface brush has a circular outer shape, and a diameter of the lower-surface brush is larger than $1/3$ of a diameter of the substrate.

14. A substrate cleaning method including:
holding a substrate in a horizontal attitude using a substrate holder;
cleaning a lower surface of the substrate held by the substrate holder using a lower-surface brush at a processing position;
cleaning the lower-surface brush using a brush cleaner at a waiting position that overlaps with the substrate held by the substrate holder in an up-and-down direction and is below the processing position; and
lifting and lowering the lower-surface brush between the processing position and the waiting position,
wherein the cleaning the lower-surface brush using a brush cleaner includes immersing the lower-surface brush in a cleaning liquid stored in a cleaning tank.

\* \* \* \* \*